(12) United States Patent
Khayat et al.

(10) Patent No.: US 11,670,396 B2
(45) Date of Patent: *Jun. 6, 2023

(54) DETERMINE BIT ERROR COUNT BASED ON SIGNAL AND NOISE CHARACTERISTICS CENTERED AT AN OPTIMIZED READ VOLTAGE

(71) Applicant: Micron Technology, Inc., Boise, ID (US)

(72) Inventors: Patrick Robert Khayat, San Diego, CA (US); Sivagnanam Parthasarathy, Carlsbad, CA (US); James Fitzpatrick, Laguna Niguel, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/551,564

(22) Filed: Dec. 15, 2021

(65) Prior Publication Data

US 2022/0108763 A1    Apr. 7, 2022

Related U.S. Application Data

(63) Continuation of application No. 16/869,503, filed on May 7, 2020, now Pat. No. 11,238,953.

(51) Int. Cl.
| G11C 29/50 | (2006.01) |
| G11C 16/26 | (2006.01) |
| G11C 11/56 | (2006.01) |
| G11C 16/10 | (2006.01) |
| G11C 16/04 | (2006.01) |

(52) U.S. Cl.
CPC .... *G11C 29/50004* (2013.01); *G11C 11/5628* (2013.01); *G11C 16/10* (2013.01); *G11C 16/26* (2013.01); *G11C 16/0483* (2013.01); *G11C 2029/5004* (2013.01)

(58) Field of Classification Search
None
See application file for complete search history.

(56) References Cited

U.S. PATENT DOCUMENTS

| 8,766,647 B2 | 7/2014 | Leibowitz et al. |
| 9,715,937 B1 | 7/2017 | Pang et al. |
| 10,062,441 B1 | 8/2018 | Vali et al. |
| 10,340,023 B1 | 7/2019 | Peng et al. |
| 11,024,401 B1 | 6/2021 | Khayat et al. |

(Continued)

*Primary Examiner* — Guerrier Merant
(74) *Attorney, Agent, or Firm* — Greenberg Traurig

(57) ABSTRACT

A memory device to estimate a bit error count of data retrievable from a group of memory cells. For example, the memory device has a group of memory cells programmed to store a predetermined number of bits per memory cells to be read at a plurality of first voltages. The memory device determines a plurality of calibrated read voltages corresponding to the plurality of first voltages respectively, based on first signal and noise characteristics of the group of memory cells. The first signal and noise characteristics are used to compute second signal and noise characteristics of the group of memory cells for the calibrated read voltages. The second signal and noise characteristics are used in an empirical formula to compute an estimate of the bit error count of data retrievable from the group of memory cells using the calibrated read voltages.

20 Claims, 10 Drawing Sheets

(56) References Cited

U.S. PATENT DOCUMENTS

| | | | |
|---|---|---|---|
| 11,049,582 B1 | 6/2021 | Parthasarathy et al. | |
| 11,177,013 B1 | 11/2021 | Khayat et al. | |
| 11,238,953 B2 * | 2/2022 | Khayat | G11C 29/50004 |
| 2014/0119124 A1 | 5/2014 | Kim et al. | |
| 2014/0143630 A1 | 5/2014 | Mu et al. | |
| 2016/0300609 A1 | 10/2016 | Han et al. | |
| 2017/0300377 A1 | 10/2017 | Kaynak et al. | |
| 2020/0111534 A1 | 4/2020 | Vali et al. | |
| 2020/0234786 A1 | 7/2020 | Hsiao | |
| 2021/0350866 A1 | 11/2021 | Khayat et al. | |
| 2021/0350867 A1 | 11/2021 | Khayat et al. | |
| 2021/0350868 A1 | 11/2021 | Parthasarathy et al. | |
| 2021/0350872 A1 | 11/2021 | Khayat et al. | |
| 2022/0013186 A1 | 1/2022 | Khayat et al. | |

* cited by examiner ized read voltage. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

DETERMINE BIT ERROR COUNT BASED ON SIGNAL AND NOISE CHARACTERISTICS CENTERED AT AN OPTIMIZED READ VOLTAGE

RELATED APPLICATIONS

The present application is a continuation application of U.S. patent application Ser. No. 16/869,503 filed May 7, 2020 and issued as U.S. Pat. No. 11,238,953 on Feb. 1, 2022, the entire disclosures of which application are hereby incorporated herein by reference.

TECHNICAL FIELD

At least some embodiments disclosed herein relate to memory systems in general, and more particularly, but not limited to memory systems configured to estimate bit error count in data retrieved using an optimized voltage for reading data from memory cells.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The embodiments are illustrated by way of example and not limitation in the figures of the accompanying drawings in which like references indicate similar elements.

DETAILED DESCRIPTION

Figure 1:
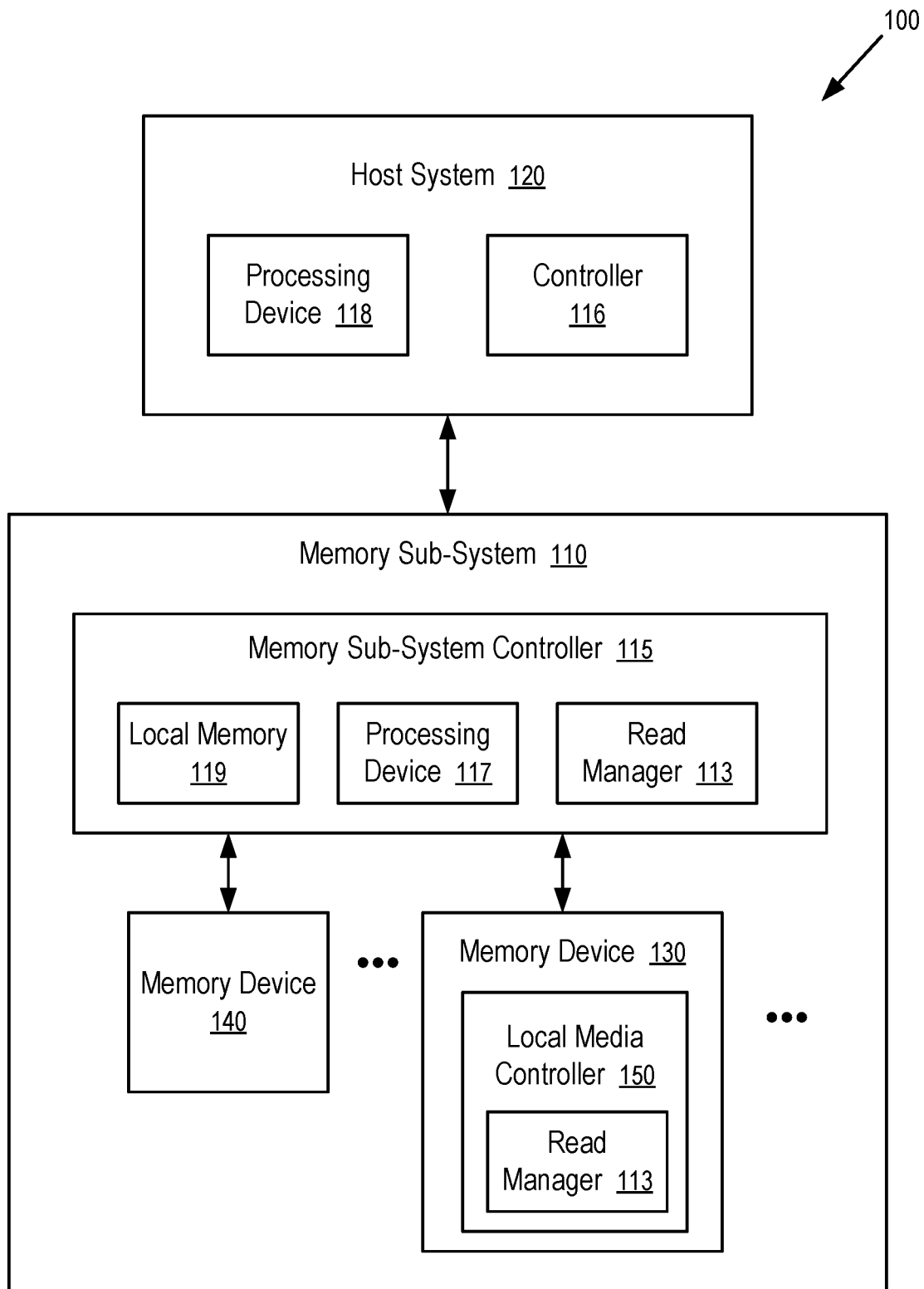
FIG. 1 illustrates an example computing system having a memory sub-system in accordance with some embodiments of the present disclosure.

At least some aspects of the present disclosure are directed to a memory sub-system configured to measure signal and noise characteristics of a group of memory cells to compute an optimized voltage for reading the group of memory cells, estimate signal and noise characteristics centered at the optimized read voltage, and use the estimated signal and noise characteristics to calculate a bit error count in data retrieved from the memory cells at the optimized read voltage. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

An integrated circuit memory cell (e.g., a flash memory cell) can be programmed to store data by the way of its state at a threshold voltage. For example, if the memory cell is configured/programmed in a state that allows a substantial current to pass the memory cell at the threshold voltage, the memory cell is storing a bit of one; and otherwise, the memory cell is storing a bit of zero. Further, a memory cell can store multiple bits of data by being configured/programmed differently at multiple threshold voltages. For example, the memory cell can store multiple bits of data by having a combination of states at the multiple threshold voltages; and different combinations of the states of the memory cell at the threshold voltages can be interpreted to represent different states of bits of data that is stored in the memory cell.

However, after the states of integrated circuit memory cells are configured/programmed using write operations to store data in the memory cells, the optimized threshold voltage for reading the memory cells can shift due to a number of factors, such as charge loss, read disturb, cross-temperature effect (e.g., write and read at different operating temperatures), etc., especially when a memory cell is programmed to store multiple bits of data.

Data can be encoded with redundant information to facilitate error detection and recovery. When data encoded with redundant information is stored in a memory sub-system, the memory sub-system can detect errors in raw, encoded data retrieved from the memory sub-system and/or recover the original, non-encoded data that is used to generate encoded data for storing in the memory sub-system. The recovery operation can be successful (or have a high probability of success) when the raw, encoded data retrieved from the memory sub-system contains less than a threshold amount of errors, or the bit error rate in the encoded data is lower than a threshold. For example, error detection and data recovery can be performed using techniques such as Error Correction Code (ECC), Low-Density Parity-Check (LDPC) code, etc.

When the encoded data retrieved from the memory cells of the memory sub-system has too many errors for successful decoding, the memory sub-system may retry the execution of the read command with adjusted parameters for reading the memory cells. However, it is inefficient to search for a set of parameters through multiple read retry with multiple rounds of calibration, reading, decoding failure, and retry, until the encoded data retrieved from the memory cells can be decoded into error free data. For example, blind searching for the optimized read voltages is inefficient. For example, one or more commands being injected between retry reads can lead to long latency for recovering data from errors.

Conventional calibration circuitry has been used to self-calibrate a memory region in applying read level signals to account for shift of threshold voltages of memory cells within the memory region. During the calibration, the calibration circuitry is configured to apply different test signals to the memory region to count the numbers of memory cells that output a specified data state for the test signals. Based on the counts, the calibration circuitry determines a read level offset value as a response to a calibration command.

At least some aspects of the present disclosure address the above and other deficiencies by computing a voltage optimized to read a group of memory cells from signal and noise characteristics of the group of memory cells using an efficient method that can be implemented in a memory device. After the optimized read voltage is computed from the measured signal and noise characteristics, signal and noise characteristics centered at the optimized read voltage can be estimated from the measured signal and noise characteristics (e.g., to estimate bit error rate).

For example, in response to a command from a controller of a memory sub-system, a memory device can automatically calibrate a voltage for reading a group of memory cells based on signal and noise characteristics measured for memory cells. The signal and noise characteristics measured for memory cells can be based on a bit count of memory cells in the group having a predetermined status when a test voltage is applied to read the memory cells. Different test voltages that are separated from one another by a predetermined voltage interval or gap can have different bit counts. The difference between bit counts of two adjacent test voltages provides the count difference for the voltage interval or gap between the adjacent test voltages. An optimized read voltage can be found at a voltage where the distribution of the count differences over voltage reaches a minimum.

When one of the count differences is smaller than its two adjacent neighbors, a minimum can be determined to be in the voltage interval or gap of the smallest count difference. An improved location of the optimized read voltage within the gap can be computed based on a ratio of adjacent neighbors, as further discussed below in connection with FIG. 5.

When no count difference is between two higher adjacent neighbors, the optimized read voltage can be identified as in a voltage interval or gap corresponding to a count difference that is smaller than two of the next two count differences. An improved location of the optimized read voltage within the gap can be computed based on a ratio of bit counts at the test voltages of the two ends of the gap, as further discussed below in connection with FIG. 6.

After an optimized read voltage is calculated (e.g., using techniques illustrated in FIGS. 3-6), the memory device can use the optimized read voltage to read memory cells and obtain hard bit data, and optionally boost modulating the applied read voltage(s) to adjacent voltages to further read the memory cells for soft bit data.

Preferably, the operations of reading the hard bit data and reading the soft bit data are scheduled together during the execution of the read command to minimize the time required to obtain the soft bit data and/or to avoid delay that can be caused by processing a separate read command, or by intervening operations on the memory cells.

Optionally, the signal and noise characteristics measured for memory cells are further used to evaluate the quality of the hard bit data retrieved using the calibrated read voltage(s). The evaluation can be performed at least in part concurrently with the reading of the hard bit data. Based on the evaluated quality of the hard bit data, the memory device may selectively read and/or transmit the soft bit data.

The hard bit data retrieved from a group of memory cells using the calibrated/optimized read voltage can be decoded using an error detection and data recovery technique, such as Error Correction Code (ECC), Low-Density Parity-Check (LDPC) code, etc. When the error rate in the hard bit data is high, the soft bit data, retrieved from the memory cell using read voltages with predetermined offsets from the calibrated/optimized read voltage, can be used to assist the decoding of the hard bit data. When the soft bit data is used, the error recovery capability is improved in decoding the hard bit data.

Optionally, a controller of a memory sub-system can initially send a command to a memory device to read hard bit data with calibrated read voltage; and in response to a failure in the decoding of the hard bit data, the controller can further send a command to the memory device to read the corresponding soft bit data. Such an implementation is efficient when the likelihood of a failure in decoding the hard bit data without soft bit data is lower than a threshold. However, when the likelihood is above the threshold, the overhead of sending the separate command becomes disadvantageous.

When the likelihood of using soft bit data is above a threshold, it is advantageous to transmit a single command to the memory device to cause the memory device to read the soft bit data and the hard bit data together. Further, the memory device can use the signal and noise characteristics of the memory cells to predict whether the soft bit data is likely to be used by the controller. If the likelihood of using of the soft bit data is lower than a threshold, the memory device can skip reading the soft bit data.

For example, during the calibration operation, the memory device can measure the signal and noise characteristics of the memory cells and use the measurements to calculate an optimized/calibrated read voltage for reading the memory cells. Once the optimized/calibrated read voltage is obtained, the memory device reads the memory cells to obtain the hard bit data. Subsequently, the memory device adjusts the already applied optimized/calibrated read voltage (e.g., through boosted modulation) to a predetermined offset (e.g., 50 mV) below the optimized/calibrated read voltage to retrieve a set of data, and further adjusts the currently applied voltage (e.g., through boosted modulation) to the predetermined offset above the optimized/calibrated read voltage to retrieve another set of data. The logic operation of XOR (exclusive or) of the two sets of data at the both sides of the offset (e.g., 50 mV) from the optimized/calibrated read voltage provides the indication of whether the memory cells provide the same reading at the offset locations around the optimized/calibrated read voltage. The result of the XOR operation can be used as soft bit data for decoding the hard bit data read using the optimized/calibrated read voltage. In some implementations, a larger offset (e.g., 90 mV) can be used to read another set of soft bit data that indicates whether the memory cells provide the same reading at the locations according to the larger offset (e.g., 90 mV) around the optimized/calibrated read voltage.

For example, in response to a read command from a controller of the memory sub-system, a memory device of the memory sub-system performs an operation to calibrate a read voltage of memory cells. The calibration is performed by measuring signal and noise characteristics through reading the memory cells at a number of voltage levels that are near an estimated location of the optimized read voltage. An optimized read voltage can be calculated based on statistical data of the results generated from reading the memory cells at the voltage levels. For example, the statistical data can include and/or can be based on counts measured by calibration circuitry at the voltage levels. Optionally, such signal and noise characteristics can be measured for sub-regions in parallel to reduce the total time for measuring the signal and noise characteristics. The statistical data of the results generated from reading the memory cells at the voltage levels can be used to predict whether the decoding of the hard bit data retrieved using the optimized read voltage is likely to require the use of soft bit data for successful decoding. Thus, the transmission of the soft bit data can be performed selectively based on the prediction.

For example, a predictive model can be generated through machine learning to estimate or evaluate the quality of data that can be retrieved from a set of memory cells using the calibrated/optimized read voltage(s). The predictive model can use features calculated from the measured signal and noise characteristics of the memory cells as input to generate a prediction. The reading and/or transmission of the soft bit data can be selectively skipped based on the prediction.

The quality of data (e.g., the error rate of the hard bit data) read using the optimized read voltage can be estimated using signal and noise characteristics of the group of memory cells. Preferably, the signal and noise characteristics used to estimate the error rate of the hard bit data is based on test voltages that are centered on the optimized read voltage. For example, a count difference between bit counts at two test voltages that have a center at the optimized read voltage can be useful in classifying the error rate of the hard bit data read using the optimized read voltage. In general, the test voltages used to measure the signal and noise characteristics for computing the optimized read voltage are not centered at the computed optimized read voltage. However, a simplified technique can be used to estimate signal and noise characteristics that would be measured at test voltages arranged according to the optimized read voltage, as further discussed in connection with FIGS. 7-11.

In some embodiments, the bit error count is estimated using an empirical formula that is a function of the signal and noise characteristics of the group of memory cells centered at the optimized read voltage. For example, when the memory cells in the group are programmed to each store multiple bits of data, the memory cells are read at a plurality of read voltages to determine the multiple bits stored in each memory cells. Each of the read voltages can be calibrated or optimized via measuring signal and noise characteristics of the group of memory cells at test voltages near the respective read voltages. For the plurality of calibrated/optimized read voltages, the signal and noise characteristics centered at the respective calibrated/optimized read voltages can be estimated without reading the group of memory cells again at test voltages centered at the respective calibrated/optimized read voltages. The estimated signal and noise characteristics centered at the respective calibrated/optimized read voltages can be used in an empirical formula to calculate the bit error count estimated.

For example, an estimated signal and noise characteristics centered at each respective calibrated/optimized read voltage can be a count difference between bit counts at two test voltages that are centered at the respective calibrated/optimized read voltage. Such a count difference can be estimated from the count differences measured to calculate the respective calibrated/optimized read voltage. A sum of such count differences estimated for the plurality of calibrated/optimized read voltages can be scaled by an empirical factor to obtain the bit error count in data retrieved from the group of memory cells. The empirical factor can be a function of the sum. For example, in one embodiment, the empirical factor is a linear function of the sum; and the coefficients in the linear function can be obtained by curve fitting measured bit error count in similar memory devices.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset (e.g., processing device 118) and a software stack executed by the processor chipset. The processor chipset can include one or more cores, one or more caches, a memory controller (e.g., controller 116) (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), Open NAND Flash Interface (ONFI), Double Data Rate (DDR), Low Power Double Data Rate (LPDDR), or any other interface. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the PCIe interface. The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The processing device 118 of the host system 120 can be, for example, a microprocessor, a central processing unit (CPU), a processing core of a processor, an execution unit, etc. In some instances, the controller 116 can be referred to as a memory controller, a memory management unit, and/or an initiator. In one example, the controller 116 controls the communications over a bus coupled between the host system 120 and the memory sub-system 110. In general, the controller 116 can send commands or requests to the memory sub-system 110 for desired access to memory devices 130, 140. The controller 116 can further include interface circuitry to communicate with the memory sub-system 110. The interface circuitry can convert responses received from the memory sub-system 110 into information for the host system 120.

The controller 116 of the host system 120 can communicate with the controller 115 of the memory sub-system 110 to perform operations such as reading data, writing data, or erasing data at the memory devices 130, 140 and other such operations. In some instances, the controller 116 is integrated within the same package of the processing device 118. In other instances, the controller 116 is separate from the package of the processing device 118. The controller 116 and/or the processing device 118 can include hardware such as one or more integrated circuits (ICs) and/or discrete components, a buffer memory, a cache memory, or a combination thereof. The controller 116 and/or the processing device 118 can be a microcontroller, special purpose logic circuitry (e.g., a field programmable gate array (FPGA), an application specific integrated circuit (ASIC), etc.), or another suitable processor. The controller 116 and/or the processing device 118 can be a microcontroller, special purpose logic circuitry (e.g., a field programmable gate array (FPGA), an application specific integrated circuit (ASIC), etc.), or another suitable processor.

The memory devices 130, 140 can include any combination of the different types of non-volatile memory components and/or volatile memory components. The volatile memory devices (e.g., memory device 140) can be, but are not limited to, random access memory (RAM), such as dynamic random access memory (DRAM) and synchronous dynamic random access memory (SDRAM).

Some examples of non-volatile memory components include a negative-and (or, NOT AND) (NAND) type flash memory and write-in-place memory, such as three-dimensional cross-point ("3D cross-point") memory. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLC) can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, or a QLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory devices such as 3D cross-point type and NAND type memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations (e.g., in response to commands scheduled on a command bus by controller 116). The controller 115 can include hardware such as one or more integrated circuits (ICs) and/or discrete components, a buffer memory, or a combination thereof. The hardware can include digital circuitry with dedicated (i.e., hard-coded) logic to perform the operations described herein. The controller 115 can be a microcontroller, special purpose logic circuitry (e.g., a field programmable gate array (FPGA), an application specific integrated circuit (ASIC), etc.), or another suitable processor.

The controller 115 can include a processing device 117 (processor) configured to execute instructions stored in a local memory 119. In the illustrated example, the local memory 119 of the controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the controller 115, in another embodiment of the present disclosure, a memory sub-system 110 does not include a controller 115, and can instead rely upon external control (e.g., provided by an external host, or by a processor or controller separate from the memory sub-system).

In general, the controller 115 can receive commands or operations from the host system 120 and can convert the commands or operations into instructions or appropriate commands to achieve the desired access to the memory devices 130. The controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices 130. The controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the controller 115 and decode the address to access the memory devices 130.

In some embodiments, the memory devices 130 include local media controllers 150 that operate in conjunction with the memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which is a raw memory device combined with a local controller (e.g., local controller 150) for media management within the same memory device package. An example of a managed memory device is a managed NAND (MNAND) device.

The controller 115 and/or a memory device 130 can include a read manager 113 configured to calculate, based on signal and noise characteristics of a group of memory cells, a voltage optimized for reading the group of memory cells, and then calculate an estimate of the bit error count in data read using the optimized voltage based on the signal and noise characteristics of the group of memory cells centered at the optimized voltage. In some embodiments, the controller 115 in the memory sub-system 110 includes at least a portion of the read manager 113. In other embodiments, or in combination, the controller 116 and/or the processing device 118 in the host system 120 includes at least a portion of the read manager 113. For example, the controller 115, the controller 116, and/or the processing device 118 can include logic circuitry implementing the read manager 113. For example, the controller 115, or the processing device 118 (processor) of the host system 120, can be configured to execute instructions stored in memory for performing the operations of the read manager 113 described herein. In some embodiments, the read manager 113 is implemented in an integrated circuit chip disposed in the memory sub-system 110. In other embodiments, the read manager 113 can be part of firmware of the memory sub-system 110, an operating system of the host system 120, a device driver, or an application, or any combination therein.

For example, the read manager 113 implemented in the controller 115 can transmit a read command or a calibration command to the memory device 130. In response to such a command, the read manager 113 implemented in the memory device 130 is configured to measure signal and noise characteristics of a group of memory cells by reading the group of memory cells at a plurality of test voltages configured near an estimated location of the optimized read voltage for the group of memory cells. The test voltages can be configured to be equally spaced by a same amount of voltage gap. From a result of reading the group of memory cells at a test voltage, a bit count of memory cells in the group are determined to be storing or reporting a predetermined bit (e.g., 0 or 1 corresponding to memory cells being conductive or non-conductive at the test voltage) when the group is read at the test voltage. A count difference can be computed from the bit counts of each pair of adjacent test voltages. The read manager 113 compares the count difference to identify a voltage interval that contains an optimized read voltage and then estimates a location in the voltage interval for the optimized read voltage based on comparing the bit counts or count differences that are closest to the voltage interval. The estimated location can be used as the optimized read voltage to read hard bit data; and voltages having predetermined offsets from the optimized read voltage can be used to read soft bit data. Signal and noise characteristics of the group of memory cells that are defined based on test voltages centered at the estimated location can be computed as part of the process of calculating the estimated location without reading the group of memory cells at test voltages configured to be centered at the estimated location of the optimized read voltage. Such signal and noise characteristics of the group of memory cells centered at the optimized read voltage can be used in an empirical formula to calculate an estimate of bit error count in the hard bit data.

Figure 2:
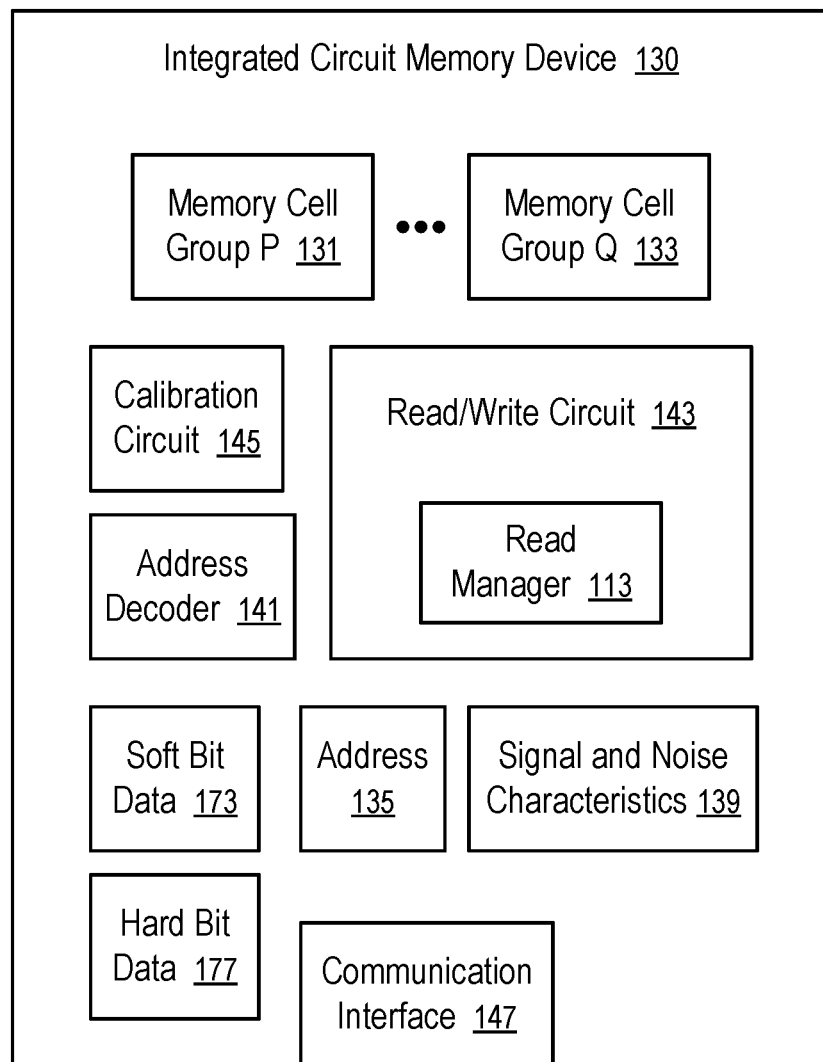
FIG. 2 illustrates an integrated circuit memory device having a calibration circuit configured to measure signal and noise characteristics according to one embodiment.

FIG. 2 illustrates an integrated circuit memory device 130 having a calibration circuit 145 configured to measure signal and noise characteristics according to one embodiment. For example, the memory devices 130 in the memory sub-system 110 of FIG. 1 can be implemented using the integrated circuit memory device 130 of FIG. 2.

The integrated circuit memory device 130 can be enclosed in a single integrated circuit package. The integrated circuit memory device 130 includes multiple groups 131, ..., 133 of memory cells that can be formed in one or more integrated circuit dies. A typical memory cell in a group 131, ..., 133 can be programmed to store one or more bits of data.

Some of the memory cells in the integrated circuit memory device 130 can be configured to be operated together for a particular type of operations. For example, memory cells on an integrated circuit die can be organized in planes, blocks, and pages. A plane contains multiple blocks; a block contains multiple pages; and a page can have multiple strings of memory cells. For example, an integrated circuit die can be the smallest unit that can independently execute commands or report status; identical, concurrent operations can be executed in parallel on multiple planes in an integrated circuit die; a block can be the smallest unit to perform an erase operation; and a page can be the smallest unit to perform a data program operation (to write data into memory cells). Each string has its memory cells connected to a common bitline; and the control gates of the memory cells at the same positions in the strings in a block or page are connected to a common wordline. Control signals can be applied to wordlines and bitlines to address the individual memory cells.

The integrated circuit memory device 130 has a communication interface 147 to receive a command having an address 135 from the controller 115 of a memory sub-system 110, retrieve both hard bit data 177 and soft bit data 173 from the memory address 135, and provide at least the hard bit data 177 as a response to the command. An address decoder 141 of the integrated circuit memory device 130 converts the address 135 into control signals to select a group of memory cells in the integrated circuit memory device 130; and a read/write circuit 143 of the integrated circuit memory device 130 performs operations to determine the hard bit data 177 and the soft bit data 173 of memory cells at the address 135.

The integrated circuit memory device 130 has a calibration circuit 145 configured to determine measurements of signal and noise characteristics 139 of memory cells in a group (e.g., 131, . . . , or 133). For example, the statistics of memory cells in a group or region that has a particular state at one or more test voltages can be measured to determine the signal and noise characteristics 139. Optionally, the signal and noise characteristics 139 can be provided by the memory device 130 to the controller 115 of a memory sub-system 110 via the communication interface 147.

In at least some embodiments, the calibration circuit 145 determines the optimized read voltage(s) of the group of memory cells based on the signal and noise characteristics 139. In some embodiments, the signal and noise characteristics 139 are further used in the calibration circuit 145 to determine whether the error rate in the hard bit data 177 is sufficiently high such that it is preferred to decode the hard bit data 177 in combination with the soft bit data 173 using a sophisticated decoder. When the use of the soft bit data 173 is predicted, based on the prediction/classification of the error rate in the hard bit data 177, the read manager 113 can transmit both the soft bit data 173 and the hard bit data 177 to the controller 115 of the memory sub-system 110.

For example, the calibration circuit 145 can measure the signal and noise characteristics 139 by reading different responses from the memory cells in a group (e.g., 131, . . . , 133) by varying operating parameters used to read the memory cells, such as the voltage(s) applied during an operation to read data from memory cells.

For example, the calibration circuit 145 can measure the signal and noise characteristics 139 on the fly when executing a command to read the hard bit data 177 and the soft bit data 173 from the address 135. Since the signal and noise characteristics 139 is measured as part of the operation to read the hard bit data 177 from the address 135, the signal and noise characteristics 139 can be used in the read manager 113 with reduced or no penalty on the latency in the execution of the command to read the hard bit data 177 from the address 135.

The read manager 113 of the memory device 130 is configured to use the signal and noise characteristics 139 to determine the voltages used to read memory cells identified by the address 135 for both hard bit data and soft bit data and to determine whether to transmit the soft bit data to the memory sub-system controller 115.

For example, the read manager 113 can use a predictive model, trained via machine learning, to predict the likelihood of the hard bit data 177 retrieved from a group of memory cells (e.g., 131 or 133) failing a test of data integrity. The prediction can be made based on the signal and noise characteristics 139. Before the test is made using error-correcting code (ECC) and/or low-density parity-check (LDPC) code, or even before the hard bit data 177 is transferred to a decoder, the read manager 113 uses the signal and noise characteristics 139 to predict the result of the test. Based on the predicted result of the test, the read manager 113 determines whether to transmit the soft bit data to the memory sub-system controller 115 in a response to the command.

For example, if the hard bit data 177 is predicted to decode using a low-power decoder that uses hard bit data 177 without using the soft bit data 173, the read manager 113 can skip the transmission of the soft bit data 173 to the memory sub-system controller 115; and the read manager 113 provides the hard bit data 177, read from the memory cells using optimized read voltages calculated from the signal and noise characteristics 139, for decoding by the low-power decoder. For example, the low-power decoder can be implemented in the memory sub-system controller 115. Alternatively, the low-power decoder can be implemented in the memory device 130; and the read manager 113 can provide the result of the lower-power decoder to the memory sub-system controller 115 as the response to the received command.

For example, if the hard bit data 177 is predicted to fail in decoding in the low-power decoder but can be decoded using a high-power decoder that uses both hard bit data and soft bit data, the read manager 113 can decide to provide both the hard bit data 177 and the soft bit data 173 for decoding by the high-power decoder. For example, the high-power decoder can be implemented in the controller 115. Alternatively, the high-power decoder can be implemented in the memory device 130.

Optionally, if the hard bit data 177 is predicted to fail in decoding in decoders available in the memory sub-system 110, the read manager 113 can decide to skip transmitting the hard bit data 177 to the memory sub-system controller 115, initiate a read retry immediately, such that when the memory sub-system controller 115 requests a read retry, at least a portion of the read retry operations is performed to reduce the time for responding to the request from the memory sub-system controller 115 for a read retry. For example, during the read retry, the read manager 113 instructs the calibration circuit 145 to perform a modified calibration to obtain a new set of signal and noise characteristics 139, which can be further used to determine improved read voltages.

The data from the memory cells identified by the address (135) can include hard bit data 177 and soft bit data 173. The hard bit data 177 is retrieved using optimized read voltages. The hard bit data 177 identifies the states of the memory cells that are programmed to store data and subsequently detected in view of changes caused by factors, such as charge loss, read disturb, cross-temperature effect (e.g., write and read at different operating temperatures), etc. The soft bit data 173 is obtained by reading the memory cells using read voltages centered at each optimized read voltage with a predetermined offset from the center, optimized read voltage. The XOR of the read results at the read voltages having the offset indicates whether the memory cells provide different read results at the read voltages having the offset. The soft bit data 173 can include the XOR results. In some instances, one set of XOR results is obtained based on a smaller offset; and another set of XOR results is obtained based on a larger offset. In general, multiple sets of XOR results can be obtained for multiple offsets, where each respective offset is used to determine a lower read voltage and a higher read voltage such that both the lower and higher read voltages have the same respective offset from an optimized read voltage to determine the XOR results.

Figure 3:
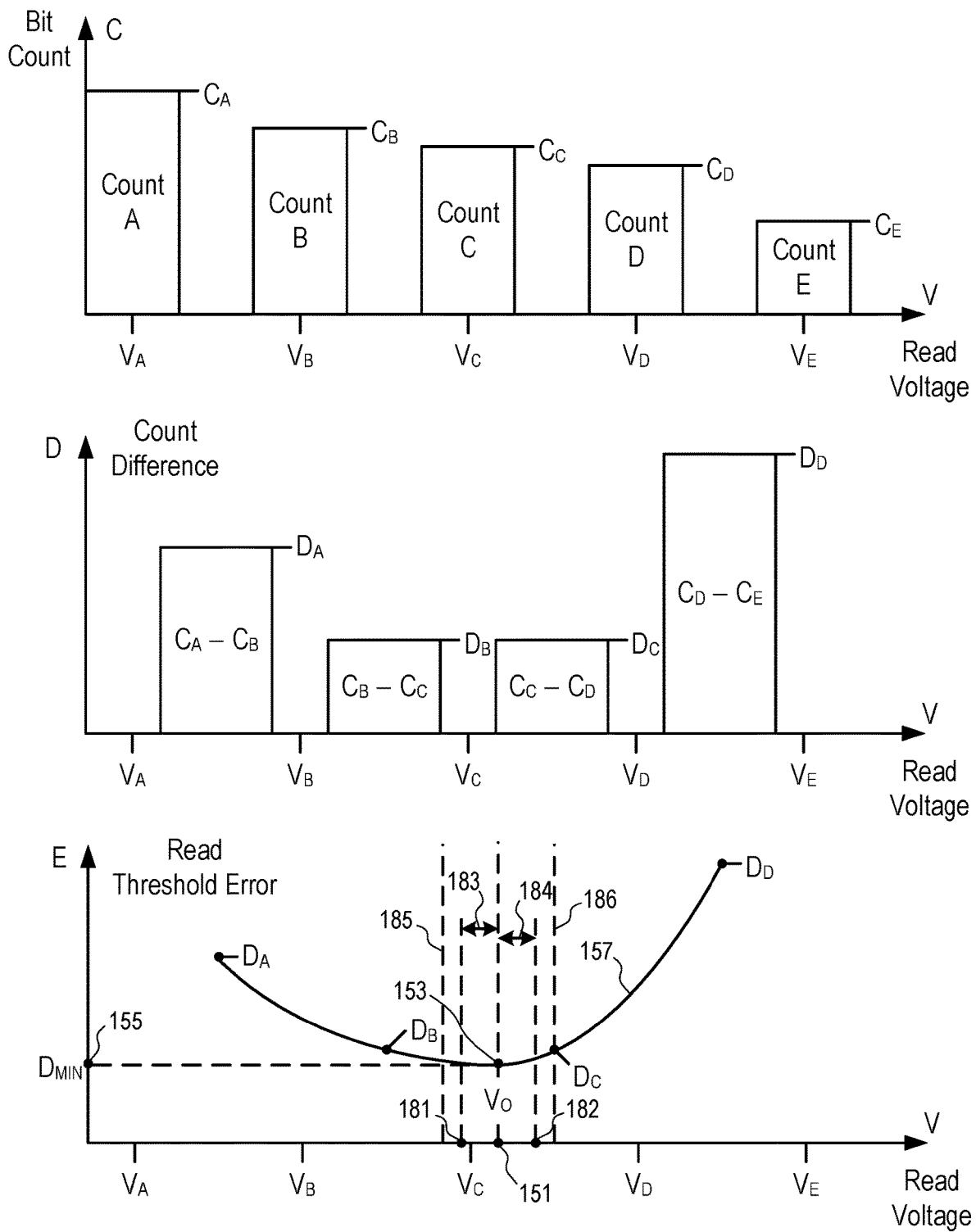
FIG. 3 shows an example of measuring signal and noise characteristics to improve memory operations according to one embodiment.

FIG. 3 shows an example of measuring signal and noise characteristics 139 to improve memory operations according to one embodiment.

In FIG. 3, the calibration circuit 145 applies different read voltages $V_A$, $V_B$, $V_C$, $V_D$, and $V_E$ to read the states of memory cells in a group (e.g., 131, . . . , or 133). In general, more or less read voltages can be used to generate the signal and noise characteristics 139.

As a result of the different voltages applied during the read operation, a same memory cell in the group (e.g., 131, . . . , or 133) may show different states. Thus, the counts $C_A$, $C_B$, $C_C$, $C_D$, and $C_E$ of memory cells having a predetermined state at different read voltages $V_A$, $V_B$, $V_C$, $V_D$, and $V_E$ can be different in general. The predetermined state can be a state of having substantial current passing through the memory cells, or a state of having no substantial current passing through the memory cells. The counts $C_A$, $C_B$, $C_C$, $C_D$, and $C_E$ can be referred to as bit counts.

The calibration circuit 145 can measure the bit counts by applying the read voltages $V_A$, $V_B$, $V_C$, $V_D$, and $V_E$ one at a time on the group (e.g., 131, ..., or 133) of memory cells.

Alternatively, the group (e.g., 131, ..., or 133) of memory cells can be configured as multiple subgroups; and the calibration circuit 145 can measure the bit counts of the subgroups in parallel by applying the read voltages $V_A$, $V_B$, $V_C$, $V_D$, and $V_E$. The bit counts of the subgroups are considered as representative of the bit counts in the entire group (e.g., 131, ..., or 133). Thus, the time duration of obtaining the counts $C_A$, $C_B$, $C_C$, $C_D$, and $C_E$ can be reduced.

In some embodiments, the bit counts $C_A$, $C_B$, $C_C$, $C_D$, and $C_E$ are measured during the execution of a command to read the data from the address 135 that is mapped to one or more memory cells in the group (e.g., 131, ..., or 133). Thus, the controller 115 does not need to send a separate command to request for the signal and noise characteristics 139 that is based on the bit counts $C_A$, $C_B$, $C_C$, $C_D$, and $C_E$.

The differences between the bit counts of the adjacent voltages are indicative of the errors in reading the states of the memory cells in the group (e.g., 133, ..., or 133).

For example, the count difference $D_A$ is calculated from $C_A - C_B$, which is an indication of read threshold error introduced by changing the read voltage from $V_A$ to $V_B$.

Similarly, $D_B = C_B - C_C$; $D_C = C_C - C_D$; and $D_D = C_D - C_E$.

The curve 157, obtained based on the count differences $D_A$, $D_B$, $D_C$, and $D_D$, represents the prediction of read threshold error E as a function of the read voltage. From the curve 157 (and/or the count differences), the optimized read voltage $V_O$ can be calculated as the point 153 that provides the lowest read threshold error $D_{MIN}$ on the curve 157.

In one embodiment, the calibration circuit 145 computes the optimized read voltage $V_O$ and causes the read/write circuit 143 to read the data from the address 135 using the optimized read voltage $V_O$.

Alternatively, the calibration circuit 145 can provide, via the communication interface 147 to the controller 115 of the memory sub-system 110, the count differences $D_A$, $D_B$, $D_C$, and $D_D$ and/or the optimized read voltage $V_O$ calculated by the calibration circuit 145.

FIG. 3 illustrates an example of generating a set of statistical data (e.g., bit counts and/or count differences) for reading at an optimized read voltage $V_O$. In general, a group of memory cells can be configured to store more than one bit in a memory cell; and multiple read voltages are used to read the data stored in the memory cells. A set of statistical data can be similarly measured for each of the read voltages to identify the corresponding optimized read voltage, where the test voltages in each set of statistical data are configured in the vicinity of the expected location of the corresponding optimized read voltage. Thus, the signal and noise characteristics 139 measured for a memory cell group (e.g., 131 or 133) can include multiple sets of statistical data measured for the multiple threshold voltages respectively.

For example, the controller 115 can instruct the memory device 130 to perform a read operation by providing an address 135 and at least one read control parameter. For example, the read control parameter can be a suggested read voltage.

The memory device 130 can perform the read operation by determining the states of memory cells at the address 135 at a read voltage and provide the data according to the determined states.

During the read operation, the calibration circuit 145 of the memory device 130 generates the signal and noise characteristics 139. The data and the signal and noise characteristics 139 are provided from the memory device 130 to the controller 115 as a response. Alternatively, the processing of the signal and noise characteristics 139 can be performed at least in part using logic circuitry configured in the memory device 130. For example, the processing of the signal and noise characteristics 139 can be implemented partially or entirely using the processing logic configured in the memory device 130. For example, the processing logic can be implemented using Complementary metal-oxide-semiconductor (CMOS) circuitry formed under the array of memory cells on an integrated circuit die of the memory device 130. For example, the processing logic can be formed, within the integrated circuit package of the memory device 130, on a separate integrated circuit die that is connected to the integrated circuit die having the memory cells using Through-Silicon Vias (TSVs) and/or other connection techniques.

The signal and noise characteristics 139 can be determined based at least in part on the read control parameter. For example, when the read control parameter is a suggested read voltage for reading the memory cells at the address 135, the calibration circuit 145 can compute the read voltages $V_A$, $V_B$, $V_C$, $V_D$, and $V_E$ that are in the vicinity of the suggested read voltage.

The signal and noise characteristics 139 can include the bit counts $C_A$, $C_B$, $C_C$, $C_D$, and $C_E$. Alternatively, or in combination, the signal and noise characteristics 139 can include the count differences $D_A$, $D_B$, $D_C$, and $D_D$.

Optionally, the calibration circuit 145 uses one method to compute an optimized read voltage $V_O$ from the count differences $D_A$, $D_B$, $D_C$, and $D_D$; and the controller 115 uses another different method to compute the optimized read voltage $V_O$ from the signal and noise characteristics 139 and optionally other data that is not available to the calibration circuit 145.

When the calibration circuit 145 can compute the optimized read voltage $V_O$ from the count differences $D_A$, $D_B$, $D_C$, and $D_D$ generated during the read operation, the signal and noise characteristics can optionally include the optimized read voltage $V_O$. Further, the memory device 130 can use the optimized read voltage $V_O$ in determining the hard bit data in the data from the memory cells at the address 135. The soft bit data in the data can be obtained by reading the memory cells with read voltages that are a predetermined offset away from the optimized read voltage $V_O$. Alternatively, the memory device 130 uses the controller-specified read voltage provided in the read control parameter in reading the data.

The controller 115 can be configured with more processing power than the calibration circuit 145 of the integrated circuit memory device 130. Further, the controller 115 can have other signal and noise characteristics applicable to the memory cells in the group (e.g., 133, ..., or 133). Thus, in general, the controller 115 can compute a more accurate estimation of the optimized read voltage $V_O$ (e.g., for a subsequent read operation, or for a retry of the read operation).

In general, it is not necessary for the calibration circuit 145 to provide the signal and noise characteristics 139 in the form of a distribution of bit counts over a set of read voltages, or in the form of a distribution of count differences over a set of read voltages. For example, the calibration circuit 145 can provide the optimized read voltage $V_O$ calculated by the calibration circuit 145, as signal and noise characteristics 139.

The calibration circuit 145 can be configured to generate the signal and noise characteristics 139 (e.g., the bit counts, or bit count differences) as a byproduct of a read operation. The generation of the signal and noise characteristics 139 can be implemented in the integrated circuit memory device 130 with little or no impact on the latency of the read operation in comparison with a typical read without the generation of the signal and noise characteristics 139. Thus, the calibration circuit 145 can determine signal and noise characteristics 139 efficiently as a byproduct of performing a read operation according to a command from the controller 115 of the memory sub-system 110.

In general, the calculation of the optimized read voltage $V_O$ can be performed within the memory device 130, or by a controller 115 of the memory sub-system 110 that receives the signal and noise characteristics 139 as part of enriched status response from the memory device 130.

The hard bit data 177 can be obtained by applying the optimized read voltage $V_O$ on the group of memory cells and determining the state of the memory cells while the memory cells are subjected to the optimized read voltages $V_O$.

The soft bit data 173 can be obtained by applying the read voltages 181 and 182 that are offset from the optimized read voltage $V_O$ with a predetermined amount. For example, the read voltage 181 is at the offset 183 of the predetermined amount lower from the optimized read voltage $V_O$; and the read voltage 182 is at the offset 184 of the same predetermined amount higher from the optimized read voltage $V_O$. A memory cell subjected to the read voltage 181 can have a state that is different from the memory cell subjected to the read voltage 182. The soft bit data 173 can include or indicate the XOR result of the data read from the memory cell using the read voltages 181 and 182. The XOR result shows whether the memory cell subjected to the read voltage 181 has the same state as being to the read voltage 182.

Figure 4:
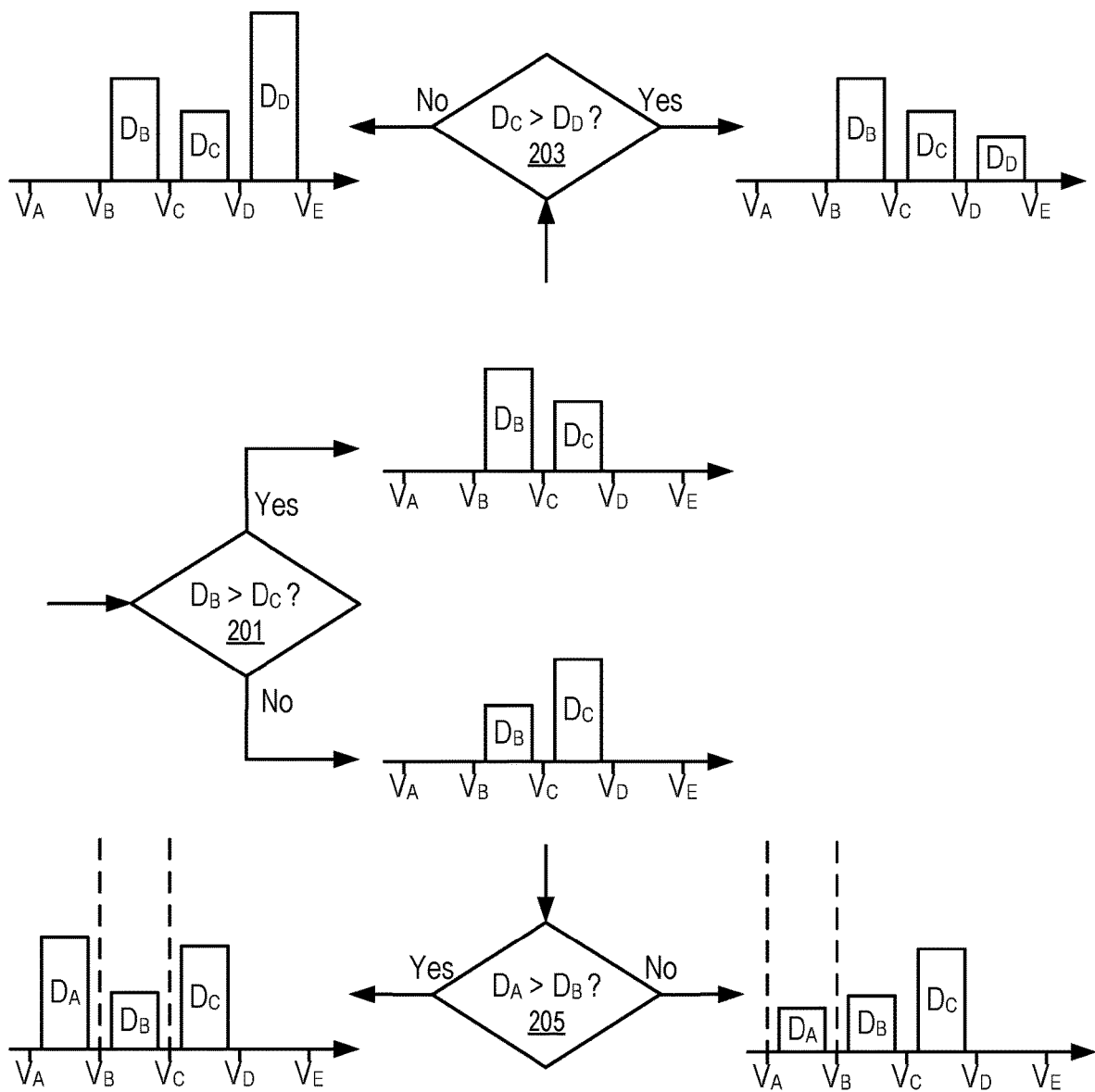
FIGS. 4-6 illustrate a technique to compute an optimized read voltage from count differences according to one embodiment.
Figure 5:
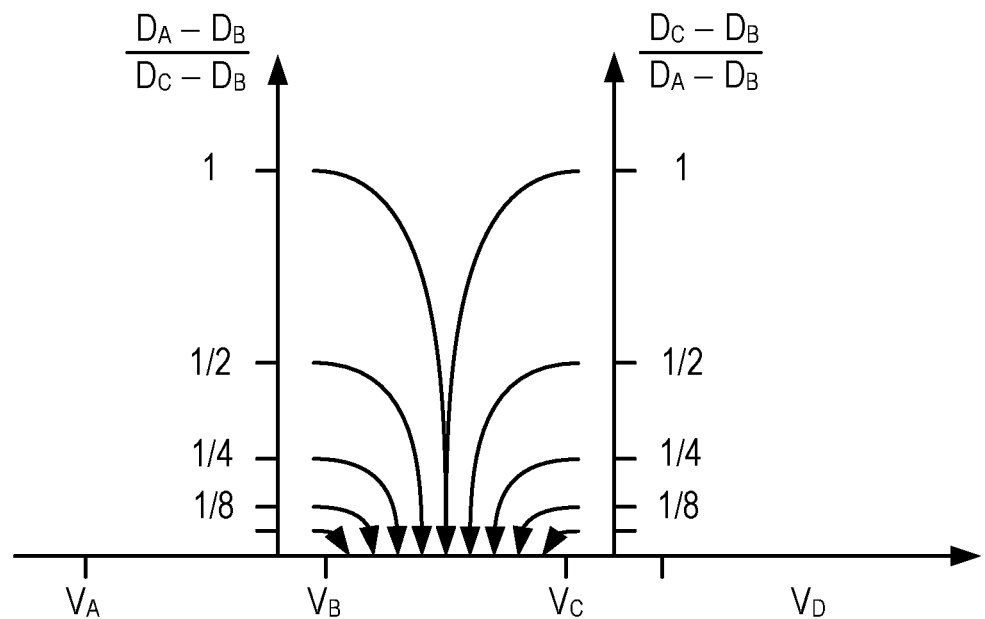
Figure 6:
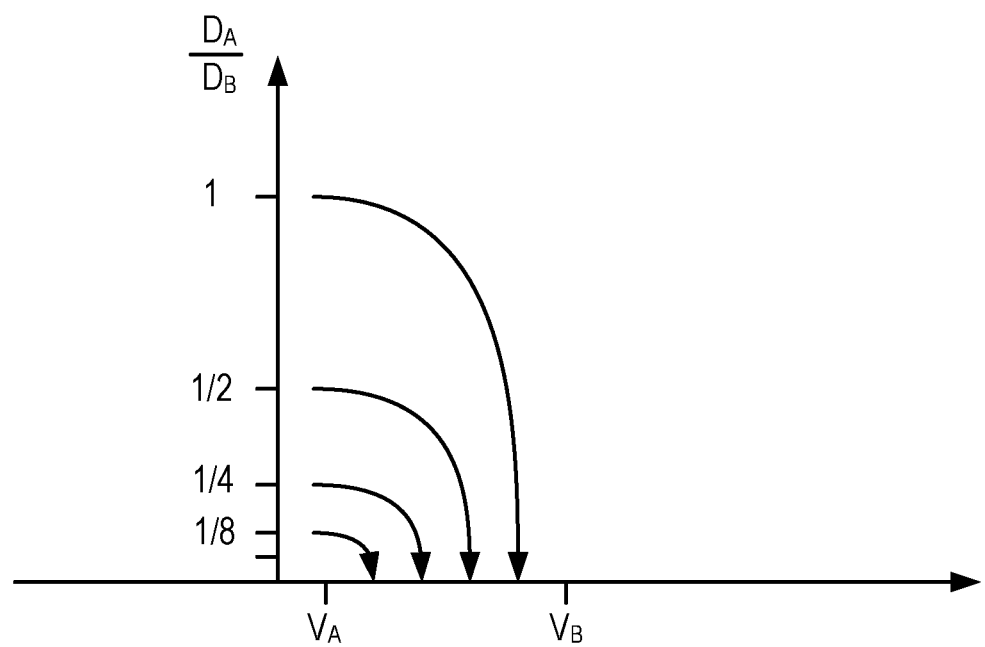

FIGS. 4-6 illustrate a technique to compute an optimized read voltage from count differences according to one embodiment. The technique of FIGS. 4-6 simplifies the computation for calculating the optimized read voltage $V_O$ such that the computation can be implemented using reduced computing power and/or circuitry.

The computation illustrated in FIGS. 4-6 can be performed based on the bit counts and count differences illustrated in FIG. 3 for test voltages $V_A$, $V_B$, $V_C$, $V_D$, and $V_E$.

In FIG. 4, an operation 201 is performed to compare the two center count differences $D_B$ and $D_C$.

If $D_B$ is greater than $D_C$, it can be assumed that a minimal can be found on the higher half of the test voltage region between $V_C$ to $V_E$. Thus, operation 203 is performed to compare the lower one $D_C$ of the two center bit count differences with its other neighbor $D_D$.

If $D_C$ is no greater than its other neighbor $D_D$, $D_C$ is no greater than its neighbors $D_B$ and $D_D$. Thus, it can be inferred that a minimal can be found between the test voltages $V_C$ and $V_D$. Based on a ratio between the differences of $D_C$ from its neighbors $D_B$ and $D_D$, an estimate of the location of the optimized read voltage $V_O$ can be determined using a technique similar to that illustrated in FIG. 5.

If $D_C$ is greater than its other neighbor $D_D$, it can be assumed that a minimal can be in the highest test voltage interval between $V_D$ and $V_E$. Thus, an estimate of the location of the optimized read voltage $V_O$ can be determined using a technique similar to that illustrated in FIG. 6, based on a ratio of count differences $D_D$ and $D_C$ that are closest to the test voltages $V_D$ and $V_E$.

Similarly, if $D_B$ is no greater than $D_C$, it can be assumed that a minimal can be found on the lower half of the test voltage region between $V_A$ to $V_C$. Thus, operation 205 is performed to compare the lower one $D_B$ of the two center bit count differences with its other neighbor $D_A$.

If $D_B$ is less than its other neighbor $D_A$, $D_B$ is no greater than its neighbors $D_A$ and $D_C$. Thus, it can be inferred that a minimal can be found between the test voltages $V_B$ and $V_C$. Based on a ratio between the differences of $D_B$ from its neighbors $D_A$ and $D_C$, an estimate of the location of the optimized read voltage $V_O$ can be determined using a technique illustrated in FIG. 5.

If $D_B$ is no less than its other neighbor $D_A$, it can be assumed that a minimal can be in the lowest test voltage interval between $V_A$ and $V_B$. Thus, an estimate of the location of the optimized read voltage $V_O$ can be determined using a technique illustrated in FIG. 6, based on a ratio of the count differences $D_A$ and $D_B$ that are closest to the test voltages $V_A$ and $V_B$.

FIG. 5 illustrates a technique to estimate the location of the optimized read voltage $V_O$ when a center count difference $D_B$ is no greater than its neighbors $D_A$ and $D_C$.

Since the count difference $D_B$ is the difference of bit counts $C_B$ and $C_C$ at test voltages $V_B$ and $V_C$, the location of the optimized read voltage $V_O$ is estimated to be within the voltage interval or gap between $V_B$ and $V_C$.

When the increases from the center count difference $D_B$ to its neighbors $D_A$ and $D_C$ are substantially equal to each other, the optimized read voltage $V_O$ is estimated at the midpoint between $V_B$ and $V_C$.

The ratio between the increases from the center count difference $D_B$ to its neighbors $D_A$ and $D_C$ can be mapped in a logarithmic scale to a line scale of division between the test voltages $V_B$ and $V_C$.

For example, the ratio $(D_A-D_B)/(D_C-D_B)$ of 1 is mapped to a location of the optimized read voltage at the midpoint between the test voltages $V_B$ and $V_C$.

The ratio $(D_A-D_B)/(D_C-D_B)$ of 1/2 is mapped to a location of the optimized read voltage at the midpoint between the test voltages $V_B$ and $V_C$ with an offset of a fixed increment towards $V_B$. For example, the increment can be one tenth of the voltage gap between $V_B$ and $V_C$.

Similarly, the ratio $(D_A-D_B)/(D_C-D_B)$ of 1/4, 1/8, or 1/16 is mapped to a location of the optimized read voltage at the midpoint between the test voltages $V_B$ and $V_C$ with an offset of two, three, or four increments towards $V_B$. A ratio $(D_A-D_B)/(D_C-D_B)$ smaller than 1/16 can be mapped to a location of the optimized read voltage at $V_B$.

Similarly, the ratio $(D_C-D_B)/(D_A-D_B)$ of 1/2, 1/4, 1/8, or 1/16 is mapped to a location of the optimized read voltage at the midpoint between the test voltages $V_B$ and $V_C$ with an offset of one, two, three, or four increments towards $V_C$. A ratio $(D_C-D_B)/(D_A-D_B)$ smaller than 1/16 can be mapped to a location of the optimized read voltage at $V_C$.

The technique of FIG. 5 can be implemented via setting a coarse estimation of the optimized read voltage at $V_B$ (or $V_C$) and adjusting the coarse estimation through applying the increment according to comparison of the increase $(D_A-D_B)$ of the count difference $D_B$ to the count difference $D_A$ with fractions or multiples of the increase $(D_C-D_B)$ of the count difference $D_B$ to the count difference $D_C$. The fractions or multiples of the increase $(D_C-D_B)$ in a logarithmic scale can be computed through iterative division or multiplication by two, which can be implemented efficiently through bit-wise left shift or right shift operations.

For example, the initial estimate of the optimized voltage $V_O$ can be set at the test voltage $V_B$. The increase ($D_A-D_B$) can be compared with ($D_C-D_B$)/16, which can be computed through shifting the bits of ($D_C-D_B$). If ($D_A-D_B$) is greater than ($D_C-D_B$)/16, the increment of one tenth of the gap between $V_B$ and $V_C$ can be added to the estimate of the optimized voltage $V_O$. Subsequently, ($D_A-D_B$) is compared to ($D_C-D_B$)/8, which can be calculated by shifting the bits of ($D_C-D_B$)/16. If ($D_A-D_B$) is greater than ($D_C-D_B$)/8, the same increment of one tenth of the gap between $V_B$ and $V_C$ is further added to the estimation of the optimized voltage $V_O$. Similarly, ($D_A-D_B$) is compared to ($D_C-D_B$)/4, ($D_C-D_B$)/2, ($D_C-D_B$), ($D_C-D_B$)*2, ($D_C-D_B$)*4, ($D_C-D_B$)*8, and ($D_C-D_B$)*16 one after another. If ($D_A-D_B$) is greater than any of these scaled versions of ($D_C-D_B$) in a comparison, the same increment is added to the estimate. After the series of comparisons, the resulting estimate can be used as the optimized voltage $V_O$.

FIG. 6 illustrates a technique to estimate the location of the optimized read voltage $V_O$ when a side count difference $D_A$ is smaller than its next two count differences $D_B$ and $D_C$, but one of its neighbors has not been measured (e.g., a count difference between the test voltage $V_A$ and a further test voltage that is lower than $V_A$).

Since the count difference $D_A$ is the lowest among count differences $D_A$, $D_B$ and $D_C$, the optimized voltage $V_O$ is estimated to be in the test voltage interval gap corresponding to the count difference $D_A$. Since the count difference $D_A$ is the difference of bit counts $C_A$ and $C_B$ at test voltages $V_A$ and $V_B$, the location of the optimized read voltage $V_O$ is estimated to be within the voltage interval or gap between $V_A$ and $V_B$.

In FIG. 6, the location of the optimized read voltage $V_O$ within the voltage interval or gap between $V_A$ and $V_B$ is based on a ratio of the count differences $D_A$ and $D_B$. The ratio $D_A/D_B$ in a logarithmic scale is mapped to the linear distribution of the optimized read voltage $V_O$ between $V_A$ and $V_B$.

For example, the voltage interval or gap between $V_A$ and $V_B$ can be divided into five equal increments. The initial estimate of the optimized voltage $V_O$ can be set at the test voltage $V_B$. The count difference $D_A$ can be compared to scaled versions of the count difference $D_B$ sequentially, such as $D_B$, $D_B/2$, and $D_B/4$. If the count difference $D_A$ is smaller than any of the scaled versions of the count difference $D_B$ in a comparison, the estimate is reduced by the increment for moving towards the test voltage $V_A$.

The curve 157 in FIG. 3 illustrates the change of count difference as a function of the center of test voltage interval. For example, count difference $D_A$ is at the center of the test voltage interval between $V_A$ and $V_B$; count difference $D_B$ is at the center of the test voltage interval between $V_B$ and $V_C$; count difference $D_C$ is at the center of the test voltage interval between $V_C$ and $V_D$; and count difference $D_D$ is at the center of the test voltage interval between $V_D$ and $V_E$.

The minimum point $D_{MIN}$ on the curve 157 represents a count difference between a test voltage interval centered at the optimized read voltage $V_O$. The minimum point $D_{MIN}$ can be calculated using the technique illustrated in FIGS. 7 to 10.

FIGS. 7 to 10 illustrate a technique to estimate signal and noise characteristics centered at an optimized read voltage according to one embodiment.

When the optimized read voltage $V_O$ is determined to be within the center test voltage intervals (e.g., $V_B$ to $V_C$, and $V_C$ to $V_D$) (e.g., through the comparisons 201 to 205 illustrated in FIG. 4), the optimized read voltage $V_O$ is in a test voltage interval of a count difference (e.g., $D_B$) that is between its two neighbors (e.g., $D_A$ and $D_C$). The minimum point $D_{MIN}$ of such an optimized read voltage $V_O$ can be determined using a technique of FIG. 7.

Figure 7:
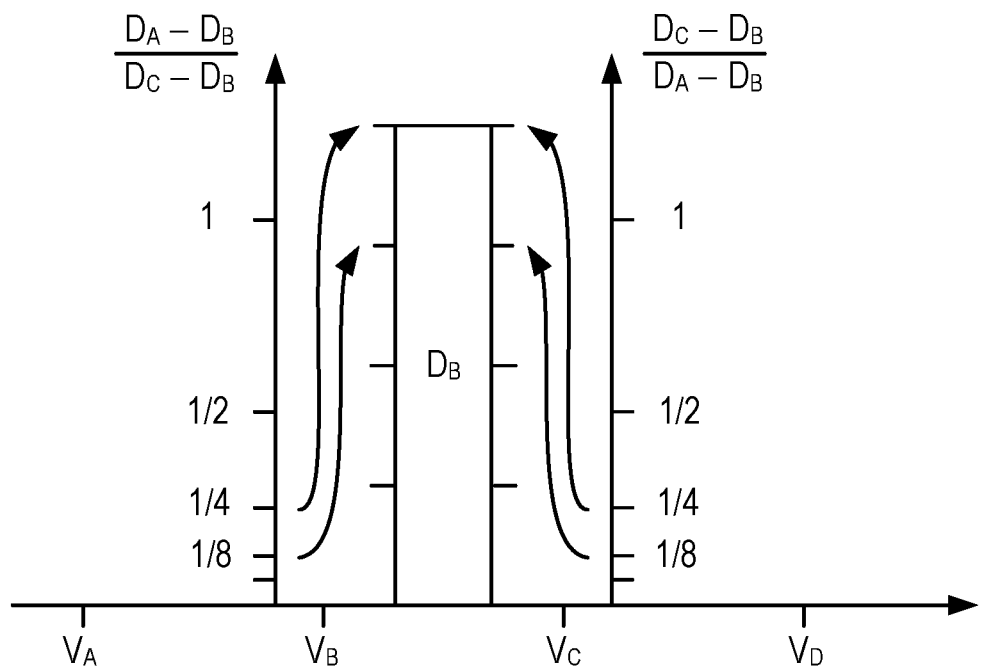
FIGS. 7 to 10 illustrate a technique to estimate signal and noise characteristics centered at an optimized read voltage according to one embodiment.

In FIG. 7, $D_{MIN}$ is mapped to a fraction of $D_B$ based on the ratio of its differences from its neighbors $D_A$ and $D_C$. When the ratio ($D_A-D_B$)/($D_C-D_B$) is less than 1/4 or greater than 4, $D_{MIN}$ is estimated as $D_B*3/4$. When the ratio ($D_A-D_B$)/($D_C-D_B$) is between 1/4 and 4, $D_{MIN}$ is estimated as $D_B$.

The count difference $D_{MIN}$ corresponds to a difference between a bit count measured at a test voltage that is half of the test voltage gap $V_B-V_C$ below the optimized read voltage $V_O$ and a bit count measured at a test voltage that is half of the test voltage gap $V_B-V_C$ above the optimized read voltage $V_O$. The count difference $D_{MIN}$ represents the count of memory cells in the group that have threshold voltages located between half of the test voltage gap $V_B-V_C$ below and above the optimized read voltage $V_O$.

In some implementations, a count difference $D_{MIN2}$ is a difference between a bit count measured at a test voltage that is the full test voltage gap $V_B-V_C$ below the optimized read voltage $V_O$ and a bit count measured at a test voltage that is the full test voltage gap $V_B-V_C$ above the optimized read voltage $V_O$. Such a count difference $D_{MIN2}$ can also be useful in the determination of the quality of data (e.g., the error rate of the hard bit data) read using the optimized read voltage $V_O$.

Figure 8:
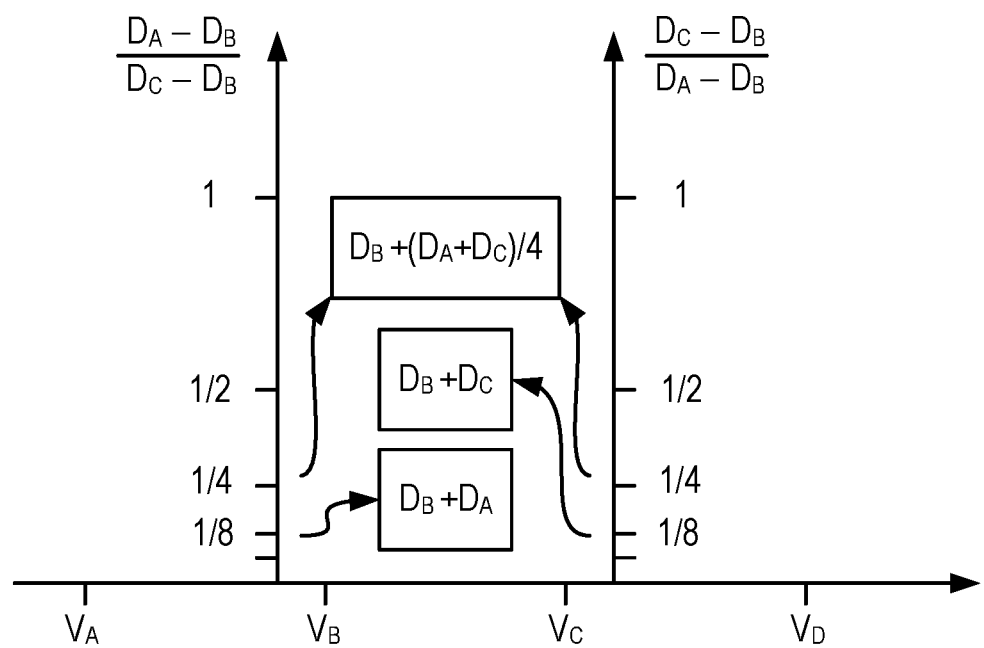

FIG. 8 illustrates an example to estimate $D_{MIN2}$ given the ratio of ($D_A-D_B$)/($D_C-D_B$). When the ratio is between 1/4 and 4, $D_{MIN2}$ is estimated as $D_B+(D_A+D_C)/4$. When the ratio is less than 1/4, $D_{MIN2}$ is estimated as $D_B+D_A$; and when the ratio is greater than 4, $D_{MIN2}$ is estimated as $D_B+D_C$. Other estimation schemes can also be used to simplify computation while maintaining a desired level of accuracy.

The mapping schemes of FIG. 7 and FIG. 8 can be combined with the technique of computing the optimized read voltage $V_O$ illustrated in FIG. 5. In FIG. 5, the ratio ($D_A-D_B$)/($D_C-D_B$) is compared to 1/16, 1/8, 1/4, 1/2, 1, 2, 4, 8, and 16 to determine the optimized read voltage $V_O$. Based on the comparison results, $D_{MIN}$ can be estimated as $D_B$ or $D_B*3/4$ according to the mapping of FIG. 7; and $D_{MIN2}$ can be estimated as $D_B+D_A$, $D_B+(D_A+D_C)/4$, or $D_B$ $D_C$ according to the mapping of FIG. 8.

When the optimized read voltage $V_O$ is determined to be within a side test voltage interval (e.g., $V_A$ to $V_B$, or $V_D$ to $V_E$) (e.g., through the comparisons 201 to 205 illustrated in FIG. 4), the optimized read voltage $V_O$ can be estimated as in a test voltage interval of a count difference (e.g., $D_A$) having two closest count differences (e.g., $D_A$ and $D_B$) that are located on a same side of the count different (e.g., $D_A$) on voltage axis (e.g., using a technique illustrated in FIG. 6). The minimum point $D_{MIN}$ of such an optimized read voltage $V_O$ can be determined using a technique of FIG. 10.

Alternatively, the optimized read voltage $V_O$ can be estimated as being located at the test voltage (e.g., $V_B$) shared by the two count differences. When the optimized read voltage $V_O$ is estimated at the test voltage $V_B$, the minimum point $D_{MIN}$ of such an optimized read voltage $V_O$ can be determined using a technique of FIG. 9.

Figure 9:
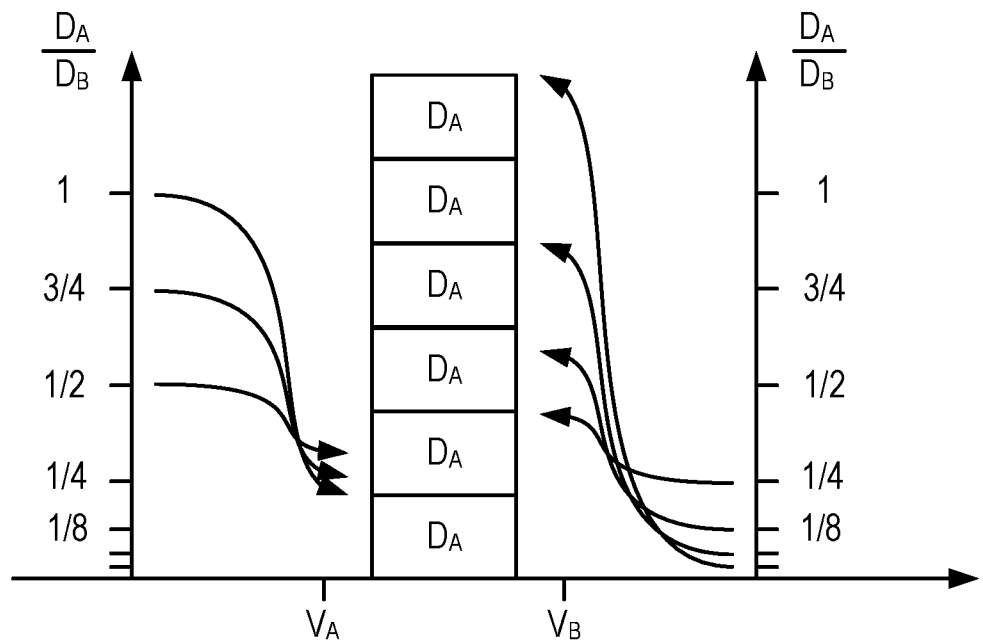
Figure 10:
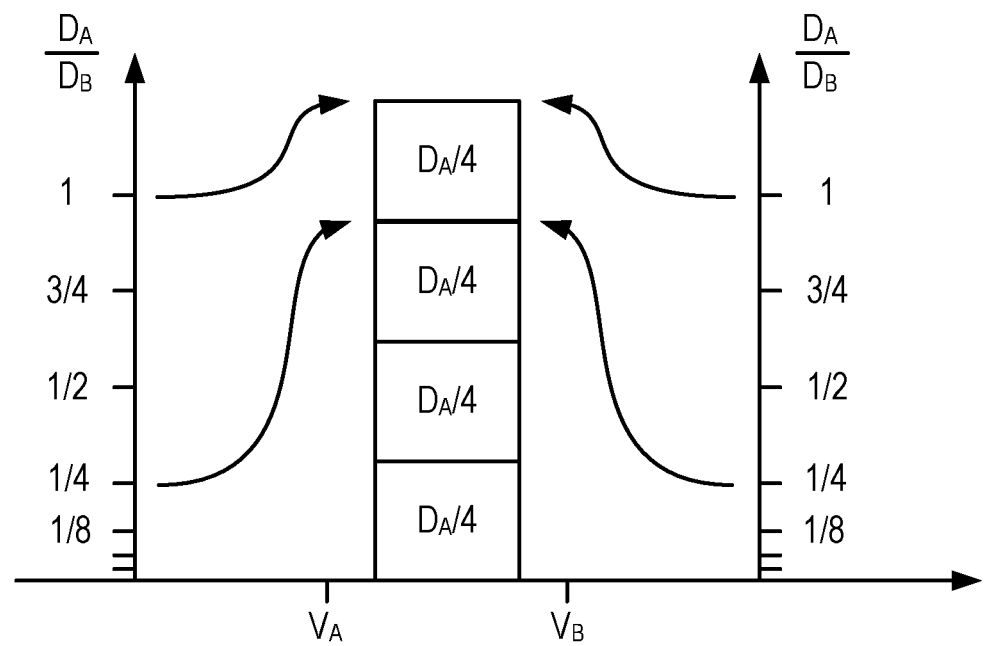

Similar to the determination of the optimized read voltage $V_O$ in FIG. 6, the determination of $D_{MIN}$ in FIG. 9 or FIG. 10 is based on the ratio between the side count difference $D_A$ and its neighbor $D_B$.

In the example of FIG. 9, the ratio $D_A/D_B$ is compared to ratios 1, 3/4, 1/2, 1/4, 1/8, 1/16, 1/32 respectively. When the ratio $D_A/D_B$ is between 1 and 3/4, $D_{MIN}$ is estimated to be the same as $D_A$. When the ratio $D_A/D_B$ is decreased down to 1/2, 1/4, 1/8, 1/16, 1/32 respectively, the estimate of $D_{MIN}$ is decreased to $D_A*5/4$, $D_A*6/4$, $D_A*2$, $D_A*11/4$, $D_A*4$, $D_A*6$ respectively. Other estimation schemes can also be used to simplify computation while maintaining a desired level of accuracy.

In FIG. 10, the ratio $D_A/D_B$ is compared to ratio 1/4. When the ratio $D_A/D_B$ is between 1 and 1/4, $D_{MIN}$ is estimated to be the same as $D_A$. When the ratio $D_A/D_B$ is decreased down up to 1/4 or lower, the estimate of $D_{MIN}$ is decreased to $D_A*3/4$.

In one embodiment, when the optimized read voltage $V_O$ is determined to be within a side test voltage interval (e.g., $V_A$ to $V_B$), the estimate of $D_{MIN2}$ for the optimized read voltage $V_O$ is the sum of the count differences closest to the test interval (e.g., $D_A+D_B$).

The techniques of FIGS. 7-10 greatly simplify the calculation of signal and noise characteristics (e.g., $D_{MIN}$ and $D_{MIN2}$) centered at the optimized read voltage $V_O$.

Figure 11:
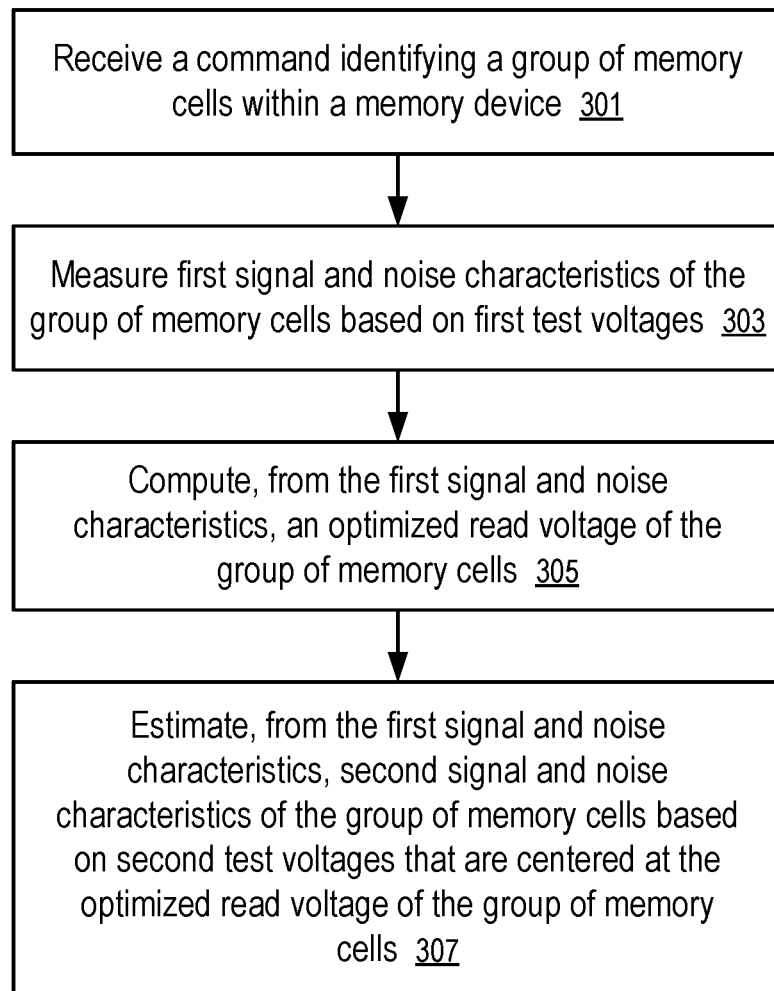
FIG. 11 shows a method to calculate signal and noise characteristics centered at an optimized read voltage for reading a group of memory cells according to one embodiment.

FIG. 11 shows a method to calculate signal and noise characteristics centered at an optimized read voltage for reading a group of memory cells according to one embodiment. The method of FIG. 11 can be performed by processing logic that can include hardware (e.g., processing device, circuitry, dedicated logic, programmable logic, microcode, hardware of a device, integrated circuit, etc.), software/firmware (e.g., instructions run or executed on a processing device), or a combination thereof. In some embodiments, the method of FIG. 11 is performed at least in part by the controller 115 of FIG. 1, or processing logic in the memory device 130 of FIG. 2. In some implementations, the computations involved in the method of FIG. 11 are greatly simplified such that the method can be performed in the memory device 130 of FIG. 2. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

For example, the method of FIG. 11 can be implemented in a computing system of FIG. 1 with a memory device of FIG. 2 and signal noise characteristics illustrated in FIG. 3 with some of the operations illustrated in FIGS. 4-10.

At block 301, a memory device 130 receives a command identifying a group of memory cells (e.g., 131 or 133) within the memory device 130. Operations at blocks 303 to 307 can be performed in response to the command.

At block 303, the memory device 130 measures first signal and noise characteristics 139 of the group of memory cells (e.g., 131 or 133) based on first test voltages (e.g., $V_A$, $V_B$, $V_C$, $V_D$, and $V_E$).

For example, the first test voltages (e.g., $V_A$, $V_B$, $V_C$, $V_D$, and $V_E$) are separated from each other by a predetermined voltage gap (e.g., $G=V_B-V_A=V_C-V_B=V_D-V_C=V_E-V_D$). Thus, each adjacent pair in the first test voltages have the same predetermined voltage gap; and the first test voltages are equally spaced according to a predetermined voltage gap.

For example, the calibration circuit 145 of the memory device 130 can be configured to measure the first signal and noise characteristics 139 by reading the group of memory cells (e.g., 131 or 133) at the plurality of first test voltages (e.g., $V_A$, $V_B$, $V_C$, $V_D$, and $V_E$). After computing bit counts (e.g., $C_A$, $C_B$, $C_C$, $C_D$, and $C_E$) at the first test voltages (e.g., $V_A$, $V_B$, $V_C$, $V_D$, and $V_E$) respectively, count differences (e.g., $D_A$, $D_B$, $D_C$, and $D_D$) in the bit counts for pairs of adjacent voltages in the first test voltages (e.g., $V_A$, $V_B$, $V_C$, $V_D$, and $V_E$) are calculated. Each bit count (e.g., $D_A$) at a test voltage (e.g., $V_A$) identifies a number of memory cells in the group (e.g., 131 or 133) that, when read at the test voltage (e.g., $V_A$), provide a predetermined bit value (e.g., 0 or 1); and each count difference (e.g., $D_A$) of a voltage interval between a pair of adjacent voltages (e.g., $V_A$ and $V_B$) in the first test voltages (e.g., $V_A$, $V_B$, $V_C$, $V_D$, and $V_E$) is a difference between bit counts (e.g., $C_A$ and $C_B$) of the pair of adjacent voltages (e.g., $V_A$ and $V_B$).

At block 305, a read manager 113 computes, from the first signal and noise characteristics 139, an optimized read voltage $V_O$ of the group of memory cells (e.g., 131 or 133).

For example, the optimized read voltage $V_O$ can be computed using the technique of FIG. 5 based on the ratio between $D_A-D_B$ and $D_C-D_B$, or using the technique of FIG. 6 based on the ratio between $D_A$ and $D_B$.

At block 307, the read manager 113 estimates, from the first signal and noise characteristics 139, second signal and noise characteristics (e.g., $D_{MIN}$ and $D_{MIN2}$) of the group of memory cells (e.g., 131 or 133) that are considered to be based on second test voltages that are centered at the optimized read voltage $V_O$ of the group of memory cells (e.g., 131 or 133). The estimation is performed without actually reading the group of memory cells (e.g., 131 or 133) at the second test voltages.

For example, the second test voltages can include: a first voltage that is a half of the predetermined voltage gap G above the optimized read voltage $V_O$; a second voltage that is a half of the predetermined voltage gap G below the optimized read voltage $V_O$; a third voltage that is the predetermined voltage gap G above the optimized read voltage $V_O$; and a fourth voltage that the predetermined voltage gap G below the optimized read voltage $V_O$. For example, the second signal and noise characteristics can include a count difference estimate between the bit count at the first voltage (e.g., $V_O+G/2$) and the bit count at the second voltage (e.g., $V_O-G/2$). The second signal and noise characteristics can further include a count difference estimate between the bit count at the third voltage (e.g., $V_O+G$) and the bit count at the fourth voltage (e.g., $V_O-G$).

Typically, at least two of the second test voltages do not coincide with any of the first test voltages (e.g., $V_A$, $V_B$, $V_C$, $V_D$, and $V_E$). In some instances, none of the second test voltages coincides with any of the first test voltages (e.g., $V_A$, $V_B$, $V_C$, $V_D$, and $V_E$).

The second signal and noise characteristics (e.g., $V_{MIN}$ and $V_{MIN2}$) can be estimated without reading the group of memory cells at the second test voltages.

For example, the second signal and noise characteristics (e.g., $D_{MIN}$ and $D_{MIN2}$) can be estimated using the techniques of FIG. 7 and FIG. 8 based on the ratio between $D_A-D_B$ and $D_C-D_B$, or the technique of FIG. 9 or FIG. 10 based on the ratio between $D_A$ and $D_B$.

In one example, when the optimized read voltage $V_O$ is determined to be in a voltage interval (e.g., $V_B$ to $V_C$) of a first count difference (e.g., $D_B$) that is no larger than two second count differences (e.g., $D_A$ and $D_C$) having voltage intervals (e.g., $V_A$ to $V_B$, and $V_C$ to $V_D$) that enclose the voltage interval (e.g., $V_B$ to $V_C$) of the first count difference (e.g., $D_B$), the memory device 130 is configured to estimate the second signal and noise characteristics (e.g., $D_{MIN}$ and $D_{MIN2}$) based on a ratio between increases (e.g., $D_A-D_B$, and $D_C-D_B$) from the first count difference (e.g., $D_B$) to the two second count differences (e.g., $D_A$ and $D_C$). For example, the memory device 130 is configured to estimate the second signal and noise characteristics (e.g., $D_{MIN}$ and $D_{MIN2}$) based on comparison of the ratio $(D_A-D_B)/(D_C-D_B)$ with 1/8, 1/4, 4, and 8, as illustrated in FIGS. 7 and 8. The comparison can be performed via compare scaled versions of the increases, such as comparing $(D_A-D_B)$ and $(D_C-D_B)/8$, or comparing $(D_A-D_B)*2$ and $(D_C-D_B)/4$.

In another example, when the optimized read voltage $V_O$ is determined to be in a voltage interval (e.g., $V_A$ to $V_B$) of a first count difference (e.g., $D_A$) that is not enclosed within two of the count differences in the bit counts for the pairs of the adjacent voltages in the first test voltages (e.g., $V_A$, $V_B$, $V_C$, $V_D$, $V_E$), the memory device 130 is configured to estimate the second signal and noise characteristics (e.g., $D_{MIN}$ and $D_{MIN2}$) based on a ratio between the first count difference (e.g., $D_A$) and a second count difference (e.g., $D_B$) having a voltage interval that is closest, in the count differences in the bit counts for the pairs of the adjacent voltages in the first test voltages, to the voltage interval of the first count difference (e.g., $D_A$). For example, the memory device is configured to estimate the second signal and noise characteristics (e.g., $D_{MIN}$ and $D_{MIN2}$) based on comparison of the ratio with $D_A/D_B$ with 3/4, 1/2, 1/4, 1/8, 1/16, and 1/32, as illustrated in FIGS. 10 and 11. The comparison can be performed via comparing scaled versions of the count differences, such as comparing $D_A$ and $D_B*3/4$, or comparing $D_A*4$ and $D_B*3$.

The scale versions can be generated efficiently through bit-wise shift operations that correspond to multiplication to a factor of two to the power of a number, and/or through addition/accumulation.

The second signal and noise characteristics (e.g., $D_{MIN}$ and $D_{MIN2}$) can be used to calculate an estimate of the bit error count in data retrieved from the group of memory cells (e.g., 131 and 133), using an empirical formula.

For example, when a group of memory cells are programmed to store multiple bits of data per memory cell, the group of memory cells can be read at a plurality of read voltages to determine the multiple bits stored in each memory cells. Reading one bit per cell from the group of memory cells includes reading the group of memory cells at some, but not all, read thresholds. Each of the read voltages can be calibrated in a way illustrated in FIG. 3 and/or using the techniques of FIGS. 4-6. Subsequently, a count difference $D_{MIN}$ of each calibrated/optimized read voltage $V_O$ can be estimated using the techniques of FIGS. 7-10. The sum $S_{DMIN}$ of the count differences (e.g., $D_{MIN}$) of the calibrated/ optimized read voltages (e.g., $V_O$) can be used in an empirical formula to calculate the count of bit errors in data read from the group of memory cells using the calibrated/optimized read voltages (e.g., $V_O$). For example, the bit error count can be estimated as $S_{DMIN}*SF$, where the scale factor can be a linear function in the form of $e_1*S_{DMIN}+e_2$. In one embodiment, $e_1=0.0086$; and $e_2=1.00283$.

Figure 12:
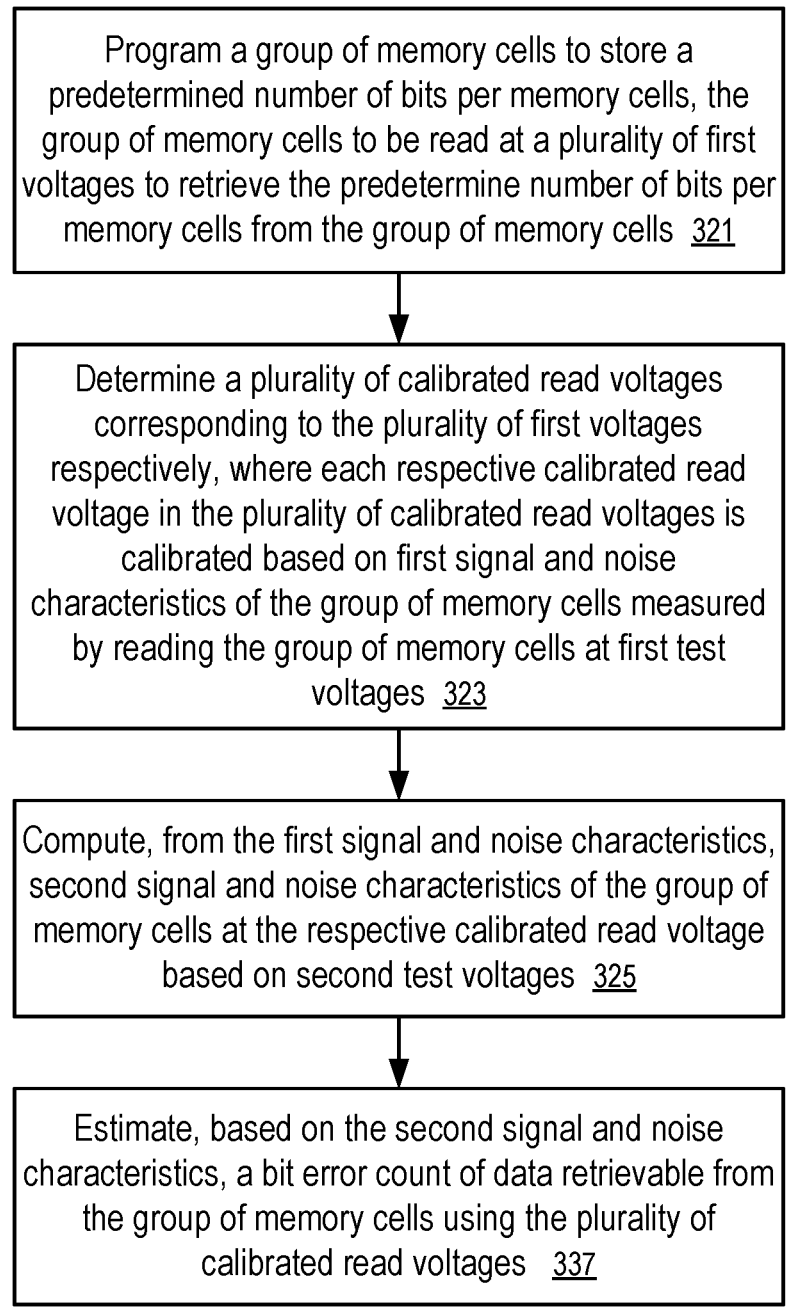
FIG. 12 shows a method to estimate a bit error count in data retrieved using a read voltage optimized for reading a group of memory cells according to one embodiment.

FIG. 12 shows a method to estimate a bit error count in data retrieved using a read voltage optimized for reading a group of memory cells according to one embodiment. The method of FIG. 12 can be performed by processing logic that can include hardware (e.g., processing device, circuitry, dedicated logic, programmable logic, microcode, hardware of a device, integrated circuit, etc.), software/firmware (e.g., instructions run or executed on a processing device), or a combination thereof. In some embodiments, the method of FIG. 11 is performed at least in part by the controller 115 of FIG. 1, or processing logic in the memory device 130 of FIG. 2. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

For example, the method of FIG. 12 can be implemented in a computing system of FIG. 2 with a memory device of FIG. 2 and signal noise characteristics illustrated in FIG. 3 with some of the operations illustrated in FIGS. 4-10.

At block 321, a memory device 130 programs a group of memory cells (e.g., 131 or 133) to store a predetermined number of bits per memory cells. Thus, the group of memory cells (e.g., 131 or 133) is be read at a plurality of first voltages to retrieve the predetermined number of bits per memory cells from the group of memory cells. The optimized voltages to read the group of memory cells may change from the plurality of first voltages over time.

At block 323, a read manager 113 determines a plurality of calibrated read voltages (e.g., $V_O$) corresponding to the plurality of first voltages respectively. Each respective calibrated read voltage (e.g., $V_O$) in the plurality of calibrated read voltages can be calibrated based on first signal and noise characteristics 139 of the group of memory cells (e.g., 131 or 133) measured by reading the group of memory cells at first test voltages (e.g., $V_A$, $V_B$, $V_C$, $V_D$, $V_E$), as illustrated in FIG. 3.

At block 325, the read manager 113 computes, from the first signal and noise characteristics 139, second signal and noise characteristics (e.g., $D_{MIN}$ and/or $D_{MIN2}$) of the group of memory cells (e.g., 131 or 133) at the respective calibrated read voltage (e.g., $V_O$) based on second test voltages centered at the respective calibrated read voltage (e.g., $V_O$).

At block 337, the read manager 113 estimates, based on the second signal and noise characteristics (e.g., $D_{MIN}$ and/or $D_{MIN2}$), a bit error count of data retrievable from the group of memory cells (e.g., 131 or 133) using the plurality of calibrated read voltages (e.g., $V_O$).

For example, the read manager 113 calculates a sum $S_{DMIN}$ of the second signal and noise characteristics (e.g., $D_{MIN}$) for the plurality of calibrated read voltages (e.g., $V_O$), compute a scale factor SF from the sum $S_{DMIN}$ according to a predetermined formula (e.g., $e_1*S_{DMIN}+e_2$), and multiplies the sum $S_{DMIN}$ by the scale factor SF to generate an estimate of the bit error count. For example, the coefficients $e_1$ and $e_2$ can be predetermined from curve fitting measured data obtained from similar memory devices.

The method of FIG. 11 can be used to compute the second signal and noise characteristics (e.g., $D_{MIN}$).

For example, the first test voltages are equally spaced according to a predetermined voltage gap $G=V_B-V_A=V_C-V_B=V_D-V_C=V_E-V_D$. The second test voltages include: an upper voltage that is a half of the predetermined voltage gap above the respective calibrated read voltage (e.g., $V_O+G/2$), and a lower voltage that is a half of the predetermined voltage gap below the respective calibrated read voltage (e.g., $V_O-G/2$).

For example, the first signal and noise characteristics 139 can include count differences (e.g., $D_A$, $D_B$, $D_C$, $D_D$) that correspond to differences of bit counts read at adjacent test voltages. For example, bit counts $C_A$ and $C_B$ represent the number of memory cells that provide a bit value of 0 (or 1) when the group of memory cells (e.g., 131 or 133) is read that the test voltages $V_A$ and $V_B$. The count difference $D_A=C_B-C_A$ is calculated for the test voltage interval from $V_A$ to $V_B$, or for the center $(V_A+V_B)/2$ of the test voltage interval. $D_{MIN}$ is the count difference for the optimized/calibrated read voltage $V_O$ for the voltage interval from $V_O-G/2$ to $V_O+G/2$. As illustrated in FIGS. 7-10, $D_{MIN}$ can be calculated/estimated from (e.g., $D_A$, $D_B$, $D_C$, $D_D$) without reading the group of memory cells at the upper voltage $V_O+G/2$ and at the lower voltage $V_O-G/2$.

The upper voltage $V_O+G/2$ and the lower voltage $V_O-G/2$ do not coincide with any of the first test voltages (e.g., $V_A$, $V_B$, $V_C$, $V_D$, $V_E$), unless $V_O$ happens to be at the center of one of the test intervals (e.g., at $(V_A+V_B)/2$, $(V_B+V_C)/2$, $(V_C+V_D)/2$, or $(V_D+V_E)/2$).

In general, the ranges of the test voltages for measuring the bit counts to determine the optimize/calibrated read voltage (e.g., $V_O$) do not overlap with each other. The range of the test voltages (e.g., $V_A$ to $V_B$) is in vicinity of the optimized/calibrated read voltage $V_O$, configured based on an initial estimate of the location of the optimized/calibrated read voltage $V_O$.

A non-transitory computer storage medium can be used to store instructions of the firmware of a memory sub-system (e.g., 110). When the instructions are executed by the controller 115 and/or the processing device 117, the instructions cause the controller 115, the processing device 117, and/or a separate hardware module to perform the methods discussed above.

Figure 13:
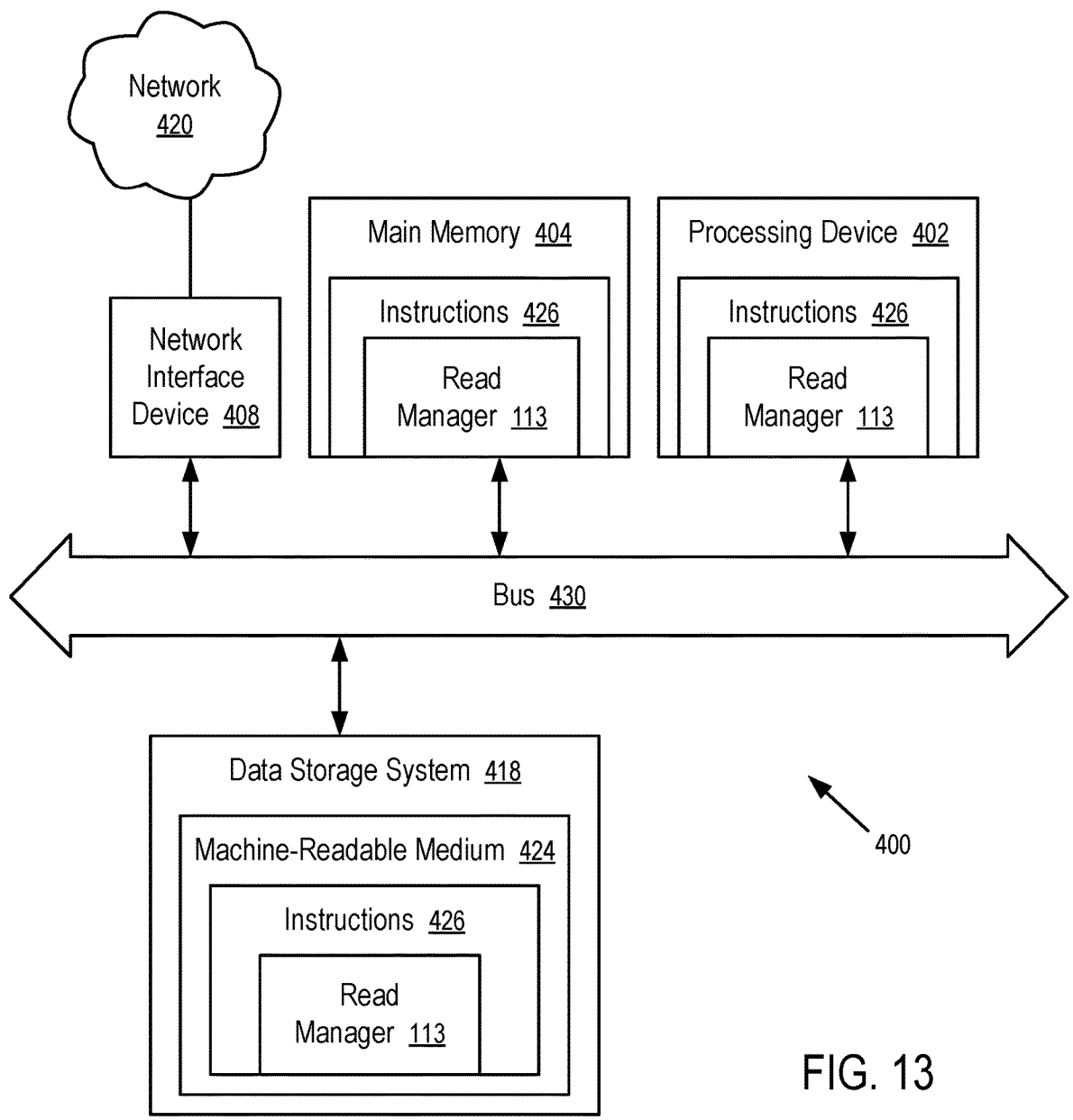
FIG. 13 is a block diagram of an example computer system in which embodiments of the present disclosure can operate.

FIG. 13 illustrates an example machine of a computer system 400 within which a set of instructions, for causing the machine to perform any one or more of the methodologies discussed herein, can be executed. In some embodiments, the computer system 400 can correspond to a host system (e.g., the host system 120 of FIG. 1) that includes, is coupled to, or utilizes a memory sub-system (e.g., the memory sub-system 110 of FIG. 1) or can be used to perform the operations of a read manager 113 (e.g., to execute instructions to perform operations corresponding to the read manager 113 described with reference to FIGS. 1-12). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 400 includes a processing device 402, a main memory 404 (e.g., read-only memory (ROM), flash memory, dynamic random access memory (DRAM) such as synchronous DRAM (SDRAM) or Rambus DRAM (RDRAM), static random access memory (SRAM), etc.), and a data storage system 418, which communicate with each other via a bus 430 (which can include multiple buses).

Processing device 402 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 402 can also be one or more special-purpose processing devices such as an application specific integrated circuit (ASIC), a field programmable gate array (FPGA), a digital signal processor (DSP), network processor, or the like. The processing device 402 is configured to execute instructions 426 for performing the operations and steps discussed herein. The computer system 400 can further include a network interface device 408 to communicate over the network 420.

The data storage system 418 can include a machine-readable storage medium 424 (also known as a computer-readable medium) on which is stored one or more sets of instructions 426 or software embodying any one or more of the methodologies or functions described herein. The instructions 426 can also reside, completely or at least partially, within the main memory 404 and/or within the processing device 402 during execution thereof by the computer system 400, the main memory 404 and the processing device 402 also constituting machine-readable storage media. The machine-readable storage medium 424, data storage system 418, and/or main memory 404 can correspond to the memory sub-system 110 of FIG. 1.

In one embodiment, the instructions 426 include instructions to implement functionality corresponding to a read manager 113 (e.g., the read manager 113 described with reference to FIGS. 1-12). While the machine-readable storage medium 424 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In this description, various functions and operations are described as being performed by or caused by computer instructions to simplify description. However, those skilled in the art will recognize what is meant by such expressions is that the functions result from execution of the computer instructions by one or more controllers or processors, such as a microprocessor. Alternatively, or in combination, the functions and operations can be implemented using special purpose circuitry, with or without software instructions, such as using Application-Specific Integrated Circuit (ASIC) or Field-Programmable Gate Array (FPGA). Embodiments can be implemented using hardwired circuitry without software instructions, or in combination with software instructions. Thus, the techniques are limited neither to any specific combination of hardware circuitry and software, nor to any particular source for the instructions executed by the data processing system.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A device, comprising:
   memory cells;
   a read circuit configured to apply voltages to the memory cells to determine states of the memory cells; and
   a logic circuit coupled to the read circuit and configured to:
   receive first data representative of first signal and noise characteristics of the memory cells;
   determine, from the first data, a plurality of read voltages to read the memory cells at a plurality of voltage levels respectively;
   compute, from the first data, second data representative of second signal and noise characteristics of the memory cells according to the plurality of read voltages; and
   estimate, based on the second data, a bit error count of data retrievable using the plurality of read voltages from the memory cells.

2. The device of claim 1, further comprising:
   an integrated circuit package configured to enclose at least the memory cells, the read circuit, and the logic circuit.

3. The device of claim 1, wherein the logic circuit is further configured to:
   calculate a sum of the second signal and noise characteristics for the plurality of read voltages; and
   scale the sum by a factor to estimate the bit error count.

4. The device of claim 3, wherein the logic circuit is further configured to:
   compute the factor from the sum according to a predetermined formula.

5. The device of claim 4, wherein the predetermined formula is a linear function of the sum with predetermined coefficients.

6. The device of claim 1, wherein to measure the first signal and noise characteristics at a voltage level among the plurality of voltage levels, the logic circuit is configured to:
   determine, using the read circuit, first states of memory cells at each respective test voltage among a plurality of first test voltages that are equally spaced according to a predetermined voltage gap;
   determine a bit count at the respective test voltage, the bit count corresponding to a count of a subset of the memory cells having a predetermined state when the test voltage is applied; and
   compute first count differences, each of the count difference corresponding to a difference between bit counts at two the plurality of first test voltages.

7. The device of claim 6, wherein the logic circuit is configured to determine, for the voltage level, a respective read voltage among the plurality of read voltages based on a minimum of the first count differences over the plurality of first test voltages.

8. The device of claim 7, wherein the second signal and noise characteristics include, for the voltage level among the plurality of voltage levels, second count differences over second test voltages calculated from the first count differences over the plurality of first test voltages.

9. The device of claim 8, wherein the second test voltages include:
   an upper voltage that is one half of the predetermined voltage gap above the respective read voltage, and
   a lower voltage that is one half of the predetermined voltage gap below the respective read voltage.

10. The device of claim 8, wherein at least two of the second test voltages do not coincide with any of the first test voltages.

11. A method, comprising:
receiving first data representative of first signal and noise characteristics of memory cells in a device;
determining, from the first data, a plurality of read voltages to read the memory cells at a plurality of voltage levels respectively;
computing, from the first data, second data representative of second signal and noise characteristics of the memory cells according to the plurality of read voltages; and
estimating, based on the second data, a bit error count of data retrievable using the plurality of read voltages from the memory cells.

12. The method of claim 11, further comprising:
calculating a sum of the second signal and noise characteristics for the plurality of read voltages; and
scaling the sum by a factor to estimate the bit error count.

13. The method of claim 12, further comprising:
computing the factor from the sum according to a predetermined formula.

14. The method of claim 13, wherein the predetermined formula is a linear function of the sum with predetermined coefficients.

15. The method of claim 11, further comprising:
measuring the first signal and noise characteristics at a voltage level among the plurality of voltage levels, by:
determining, using the read circuit, first states of memory cells at each respective test voltage among a plurality of first test voltages that are equally spaced according to a predetermined voltage gap;
determining a bit count at the respective test voltage, the bit count corresponding to a count of a subset of the memory cells having a predetermined state when the test voltage is applied; and
computing first count differences, each of the count difference corresponding to a difference between bit counts at two the plurality of first test voltages.

16. The method of claim 15, further comprising:
determining, for the voltage level, a respective read voltage among the plurality of read voltages based on a minimum of the first count differences over the plurality of first test voltages;
wherein the second signal and noise characteristics include, for the voltage level among the plurality of voltage levels, second count differences over second test voltages calculated from the first count differences over the plurality of first test voltages; and
wherein at least two of the second test voltages do not coincide with any of the first test voltages.

17. The method of claim 16, wherein the second test voltages include:
an upper voltage that is one half of the predetermined voltage gap above the respective read voltage, and
a lower voltage that is one half of the predetermined voltage gap below the respective read voltage.

18. An apparatus, comprising:
a processing device configured to transmit a command having an address; and
a memory device having:
memory cells formed on an integrated circuit die;
a first circuit operable to apply voltages to the memory cells and determine states of the memory cells being applied to the voltages; and
a second circuit coupled to the first circuit and configured to, in response to the address in the command identifying the memory cells:
receive, from the first circuit, first data representative of first signal and noise characteristics of the memory cells;
determine, from the first data, a plurality of read voltages to read the memory cells at a plurality of voltage levels respectively;
compute, from the first data, second data representative of second signal and noise characteristics of the memory cells according to the plurality of read voltages; and
estimate, based on the second data, a bit error count of data retrievable using the plurality of read voltages from the memory cells.

19. The apparatus of claim 18, wherein the first signal and noise characteristics are representative of, for each voltage level among the plurality of voltage levels evenly separated by a predetermined voltage gap, first count differences over a first plurality of test voltages;
wherein each count difference among the first count differences being a difference between:
a first count of a first subset of the memory cells having a predetermined state when a first test voltage among the first plurality of test voltages is applied to the memory cells; and
a second count of a second subset of the memory cells having the predetermined state when a second test voltage among the first plurality of test voltages is applied to the memory cells; and
wherein second signal and noise characteristics are representative of, for the voltage level, second count differences over a second plurality of test voltages determined based on a read voltage calculated from the first count differences.

20. The apparatus of claim 19, wherein the second circuit is configured to:
calculate a sum of the second signal and noise characteristics for the plurality of read voltages;
compute a factor from the sum according to a predetermined formula; and
scale the sum by the factor to estimate the bit error count.

* * * * *